United States Patent
Song et al.

(10) Patent No.: US 10,964,872 B2
(45) Date of Patent: Mar. 30, 2021

(54) COMPOSITIONS AND METHODS FOR THERMOELECTRIC CERAMICS

(71) Applicant: West Virginia University, Morgantown, WV (US)

(72) Inventors: Xueyan Song, Morgantown, WV (US); Yun Chen, Morgantown, WV (US)

(73) Assignee: West Virginia University, Morgantown, WV (US)

(*) Notice: Subject to any disclaimer, the term of this patent is extended or adjusted under 35 U.S.C. 154(b) by 318 days.

(21) Appl. No.: 15/922,982

(22) Filed: Mar. 16, 2018

(65) Prior Publication Data

US 2018/0269370 A1    Sep. 20, 2018

Related U.S. Application Data

(60) Provisional application No. 62/473,717, filed on Mar. 20, 2017.

(51) Int. Cl.
*H01L 35/22* (2006.01)
*C04B 35/01* (2006.01)
*C04B 35/624* (2006.01)
*C04B 35/626* (2006.01)
*C04B 35/64* (2006.01)

(52) U.S. Cl.
CPC ............ *H01L 35/22* (2013.01); *C04B 35/016* (2013.01); *C04B 35/624* (2013.01); *C04B 35/6262* (2013.01); *C04B 35/6267* (2013.01); *C04B 35/62655* (2013.01); *C04B 35/62695* (2013.01); *C04B 35/64* (2013.01); *C04B 2235/3208* (2013.01); *C04B 2235/3268* (2013.01); *C04B 2235/3281* (2013.01); *C04B 2235/3298* (2013.01); *C04B 2235/77* (2013.01); *C04B 2235/785* (2013.01); *C04B 2235/786* (2013.01); *C04B 2235/79* (2013.01); *C04B 2235/80* (2013.01); *C04B 2235/85* (2013.01); *C04B 2235/96* (2013.01)

(58) Field of Classification Search
CPC ..... H01L 35/22; C04B 35/616; C04B 35/624; C04B 35/6267; C04B 35/62695; C04B 35/64; C04B 2235/79; C04B 2235/80; C04B 2235/96; C04B 2235/85
See application file for complete search history.

(56) References Cited

U.S. PATENT DOCUMENTS

| 2011/0001278 A1 | 1/2011 | Sadaoka |
| 2011/0024700 A1* | 2/2011 | Sadaoka ................. H01L 35/22 252/519.51 |

FOREIGN PATENT DOCUMENTS

| CN | 105272169 | * | 1/2016 |
| EP | 2243755 | * | 10/2010 |
| EP | 2243755 A1 | | 10/2010 |
| JP | 20050514103 A | | 2/2005 |

OTHER PUBLICATIONS

Translation of CN 105272169, Jan. 27, 2016.*
Flahaut et al, "Thermoelectric Propeties of A-site Substituted Ca1—xRexMnO3", Journal of Applied Physics, 100, 084911, 1-4, Jun. 25, 2006.*
Dehkordi et al., Large Thermoelectric Power Factor in Pr-Doped SrTiO3-δ Ceramics via Grain-Boundary-Induced Mobility Enhancement, Chem. Mater., 26, 2478-2485, 2014.
Mikami et al., The effect of Ag addition on electrical properties of the thermoelectric compound Ca3Co4O9, Journal of Solid State Chemistry 178, 2186-2190, 2005.
Zeng et al., Enhanced Thermoelectric Performance of SmBaCuFeO5+d/Ag Composite Ceramics, J. Am. Ceram. Soc., [4] 1266-1270, 2016.
Ito et al., Enhancement of thermoelectric performance of NaxCo2O4 with Ag dispersion by precipitation from Ag+ aqueous solution, J Sol-Gel Sci Technol, 55:354-359, 2010.

* cited by examiner

*Primary Examiner* — C Melissa Koslow
(74) *Attorney, Agent, or Firm* — Innovators Legal

(57) ABSTRACT

In one aspect, the disclosure relates to thermoelectric ceramic oxide compositions comprising a CaMnO₃ ceramic. In a further aspect, the disclosed thermoelectric ceramic oxide compositions can dramatically increase the energy conversion efficiency of thermoelectric through a combination of modifying the chemistry of precursor materials, and simultaneously introducing a metal oxide liquid phase during sintering. In a further aspect, the present disclosure pertains to thermoelectric ceramic oxide compositions comprising a metal doped CaMnO₃ having with a metal oxide grain boundary phase; wherein the metal is selected from group 13, group 14, group 15, group 16, or a rare earth element. In a still further aspect, the disclosure relates to methods for making the thermoelectric ceramic oxide materials. This abstract is intended as a scanning tool for purposes of searching in the particular art and is not intended to be limiting of the present disclosure.

15 Claims, 10 Drawing Sheets

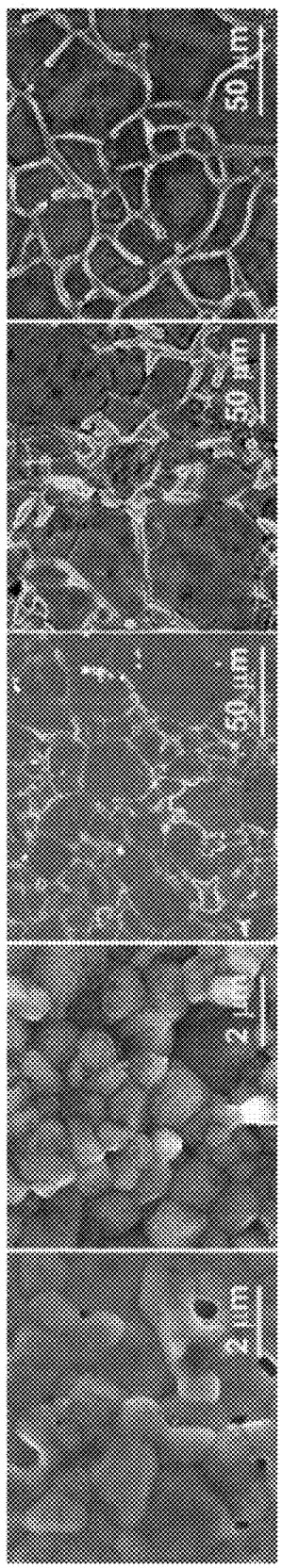

COMPOSITIONS AND METHODS FOR THERMOELECTRIC CERAMICS

CROSS-REFERENCE TO RELATED APPLICATIONS

This application claims the benefit of U.S. Provisional Application No. 62/473,717, filed on Mar. 20, 2017, which is incorporated herein by reference in its entirety.

STATEMENT REGARDING FEDERALLY SPONSORED RESEARCH

This invention was made with government support by award numbers FE0024009 by the U.S. DOE and NSF1254594 by the NSF. The government has certain rights in the invention.

BACKGROUND

The thermoelectric effect is one of the simplest energy conversion technologies converting a temperature difference directly into the electricity. To promote the development of high performance thermoelectric devices in the past decade, intense effort on thermoelectric research has been concentrated on designing new materials with high energy conversion efficiency. Transition metal oxides are of particular significant interest in various energy applications because those are earth-abundant materials, non-toxic, environmental friendly, and have great potential for mass production. However, the transition oxides have been generally regarded as poor thermoelectric materials because of their low energy conversion efficiency. The thermoelectric conversion efficiency is characterized by the figure of merit, $ZT=S^2\sigma/\kappa$, where $S$, $\sigma$, $S^2\sigma$, and $\kappa$ are the Seebeck coefficient, the electrical conductivity, power factor, and the thermal conductivity, respectively. A good thermoelectric material should have a large absolute Seebeck Coefficient $|S|$ and a high $\sigma$ together with a low $\kappa$. The state-of-the-art heavy metal based thermoelectric materials are typically have a $ZT>1$, that is corresponding to ~10% energy conversion efficiency.

Among the various oxides, cation doped $CaMnO_3$ is one of the most promising n-type materials which has a highest reported ZT value of about 0.3, and high thermal stability in air. In comparison with the state of the art heavy metal based thermoelectric materials, the oxide $CaMnO_3$ polycrystalline possesses very low thermal conductivity, and the fairly low energy conversion efficiency results from the low power factor of $S^2\sigma$, with the highest electrical power factor of ~0.4 $mWm^{-1}K^{-2}$, in comparison with the high power factor of ~2 $mWm^{-1}K^{-2}$ from that of the well-developed thermoelectric materials such as SiGe (2, 3).

To improve the ZT value of $CaMnO_3$, there is an urgent need of improving the electrical power factor. However, increasing the power factor of $CaMnO_3$ has been very challenging since the Seebeck coefficient and the electrical conductivity are both a function of carrier concentration and strongly correlated. The electrical conductivity (or the reciprocal of the electrical resistivity) will increase as the carrier concentration and carrier mobility increase. Meanwhile, the Seebeck coefficient decreases as the carrier concentration increases. As a consequence, conventional doping approaches for increasing the carrier concentration generally results in the simultaneous increase of in electrical conductivity and a decrease of Seebeck coefficient, and eventually leads to very limited increase in the overall power factor.

Despite advances in research directed towards thermoelectric materials, there a scarcity of materials comprising $CaMnO_3$ with a high ZT value. These needs and other needs are satisfied by the present disclosure.

SUMMARY

In accordance with the purpose(s) of the disclosure, as embodied and broadly described herein, the disclosure, in one aspect, relates to thermoelectric ceramic oxide compositions comprising a $CaMnO_3$ ceramic. In a further aspect, the disclosed thermoelectric ceramic oxide compositions can dramatically increase the energy conversion efficiency of thermoelectric through a combination of modifying the chemistry of precursor materials, and simultaneously introducing a metal oxide liquid phase during sintering. In a further aspect, the present disclosure pertains to thermoelectric ceramic oxide compositions comprising a metal doped $CaMnO_3$ having with a metal oxide grain boundary phase; wherein the metal is selected from group 13, group 14, group 15, group 16, or a rare earth element. In a still further aspect, the disclosure relates to methods for making the thermoelectric ceramic oxide materials.

Disclosed are thermoelectric ceramic oxide compositions comprising: bismuth doped $CaMnO_3$ with a copper oxide grain boundary phase. In a further aspect, disclosed are thermoelectric ceramic oxide compositions comprising: bismuth doped $CaMnO_3$ with a metal oxide grain boundary phase. In a still further aspect, disclosed are thermoelectric ceramic oxide compositions comprising: $CaMnO_3$ doped with a first metal; and the $CaMnO_3$ doped with a first metal has a grain boundary phase comprising an oxide of a second metal. In a yet further aspect, disclosed are thermoelectric ceramic oxide compositions comprising: bismuth doped $CaMnO_3$ with a grain boundary phase comprising a metal formed by liquid phase sintering of the metal.

In a further aspect, disclosed are methods of making a high performance, thermoelectric ceramic oxide comprising the steps of: dissolving citric acid, ethylene glycol, polyethylene glycol, nitric acid, $Bi(NO_3)_3 \cdot 5H_2O$, $Ca(NO_3)_2 \cdot 4H_2O$, $Mn(NO_3)_2 \cdot 6H_2O$, and $Cu(NO_3)_2$ in deionized water to form a solution; stirring the solution under heat to form a gel; converting the gel to ash by applying heat to the gel; grinding the ash; calcining the ground ash to form a powder; pressing the powder to form a pellet; and sintering the pellet to form a thermoelectric ceramic oxide.

In a further aspect, disclosed are methods of making a high performance, thermoelectric ceramic oxide comprising the steps of: dissolving citric acid, ethylene glycol, polyethylene glycol, nitric acid, $Bi(NO_3)_3 \cdot 5H_2O$, $Ca(NO_3)_2 \cdot 4H_2O$, $Mn(NO_3)_2 \cdot 6H_2O$, and $Cu(NO_3)_2$, and a metal nitrate in deionized water to form a solution; stirring the solution under heat to form a gel; converting the gel to ash by applying heat to the gel; grinding the ash; calcining the ground ash to form a powder; pressing the powder to form a pellet; and sintering the pellet to form a thermoelectric ceramic oxide.

In a further aspect, disclosed are methods of making a high performance, thermoelectric ceramic oxide comprising the steps of: doping a ceramic oxide formulation with a first metal and a second metal in a sol-gel process resulting in a gel; heating the gel to form an ash-based powder; compressing the ash-based powder into a pellet; and sintering the pellet to form the high performance, thermoelectric ceramic oxide with a grain boundary phase that comprises an oxide of the second metal.

While aspects of the present disclosure can be described and claimed in a particular statutory class, such as the system statutory class, this is for convenience only and one of skill in the art will understand that each aspect of the present disclosure can be described and claimed in any statutory class. Unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

BRIEF DESCRIPTION OF THE FIGURES

The accompanying figures, which are incorporated in and constitute a part of this specification, illustrate several aspects and together with the description serve to explain the principles of the disclosure.

FIGS. 6A-6E show representative scanning electron micrographs showing the significant grain growth due to Cu addition and the existence of grain boundary phase from representative disclosed compostions. FIG. 6A: $CaMnO_3$; FIG. 6B: $Ca_{0.97}Bi_{0.03}MnO_3$; FIG. 6C: $Ca_{0.97}Bi_{0.03}Cu_{0.02}MnO_3$; FIG. 6D: $Ca_{0.97}Bi_{0.03}Cu_{0.04}MnO_3$; and FIG. 6E: $Ca_{0.97}Bi_{0.03}Cu_{0.15}MnO_3$.

FIG. 13A: $Ca_{1-x}Bi_xMnO_3$; FIG. 13B: $Ca_{1-x}Bi_xMnCu_{0.04}O_3$; and FIG. 13C: $Ca_{1-x}Bi_xMnCu_{0.15}O_3$.

Figure 1A:
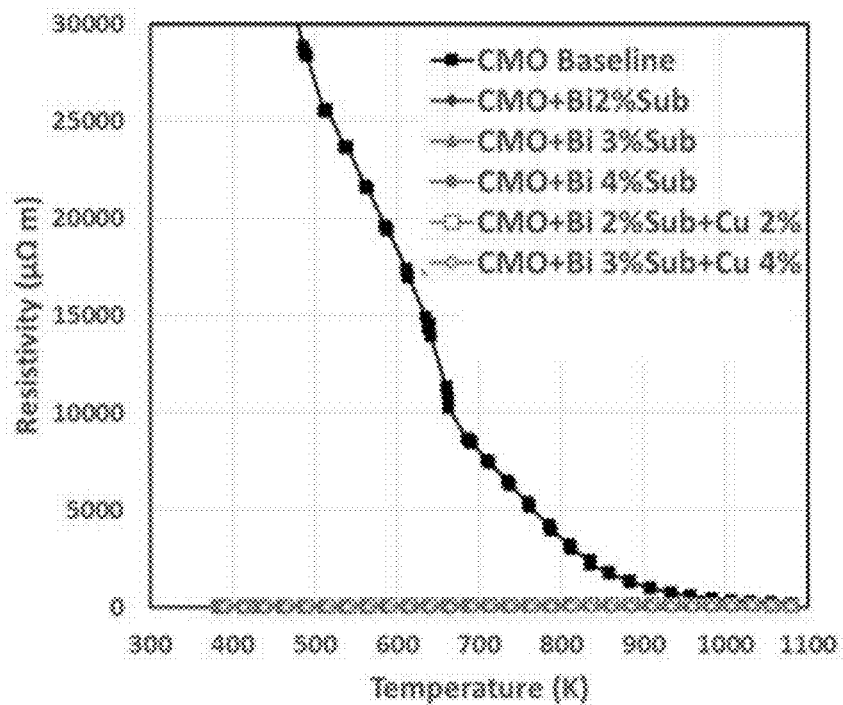
FIG. 1A shows a representative graph of temperature dependence of electrical resistivity for a representative disclosed thermoelectric ceramic oxide composition comprising $Ca_{1-x}Bi_xMnCu_yO_3$.

Additional advantages of the disclosure will be set forth in part in the description which follows, and in part will be obvious from the description, or can be learned by practice of the disclosure. The advantages of the disclosure will be realized and attained by means of the elements and combinations particularly pointed out in the appended claims. It is to be understood that both the foregoing general description and the following detailed description are exemplary and explanatory only and are not restrictive of the disclosure, as claimed.

DETAILED DESCRIPTION

The present disclosure can be understood more readily by reference to the following detailed description of the disclosure and the Examples included therein.

Definitions

As used in the specification and the appended claims, the singular forms "a," "an" and "the" include plural referents unless the context clearly dictates otherwise. Thus, for example, reference to "a functional group," "an alkyl," or "a residue" includes mixtures of two or more such functional groups, alkyls, or residues, and the like.

Ranges can be expressed herein as from "about" one particular value, and/or to "about" another particular value. When such a range is expressed, a further aspect includes from the one particular value and/or to the other particular value. Similarly, when values are expressed as approximations, by use of the antecedent "about," it will be understood that the particular value forms a further aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

References in the specification and concluding claims to parts by weight of a particular element or component in a composition denotes the weight relationship between the element or component and any other elements or components in the composition or article for which a part by weight is expressed. Thus, in a compound containing 2 parts by weight of component X and 5 parts by weight component Y, X and Y are present at a weight ratio of 2:5, and are present in such ratio regardless of whether additional components are contained in the compound.

A weight percent (wt. %) of a component, unless specifically stated to the contrary, is based on the total weight of the formulation or composition in which the component is included.

As used herein, the terms "optional" or "optionally" means that the subsequently described event or circumstance can or can not occur, and that the description includes instances where said event or circumstance occurs and instances where it does not.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; and the number or type of aspects described in the specification.

Thermoelectric Ceramic Oxide Compositions

In one aspect, the disclosure relates thermoelectric ceramic oxide compositions comprising a $CaMnO_3$ ceramic. In a further aspect, the disclosed thermoelectric ceramic oxide compositions can dramatically increase the energy conversion efficiency of thermoelectric through a combination of modifying the chemistry of precursor materials, and simultaneously introducing a metal oxide liquid phase during sintering.

In various aspects, the present disclosure pertains to thermoelectric ceramic oxide compositions comprising a metal doped $CaMnO_3$ having with a metal oxide grain boundary phase; wherein the metal is selected from group 13, group 14, group 15, group 16, or a rare earth element. In a further aspect, disclosed are thermoelectric ceramic oxide compositions comprising a metal doped $CaMnO_3$ having with a metal oxide grain boundary phase; wherein the metal is selected from Bi, Nb, Yb, Dy, Mo, W, and Gd. In a still further aspect, disclosed are thermoelectric ceramic oxide compositions comprising a metal doped $CaMnO_3$ having with a metal oxide grain boundary phase; wherein the metal is Bi. In a yet further aspect, disclosed are thermoelectric ceramic oxide compositions comprising a metal doped $CaMnO_3$ having with a metal oxide grain boundary phase; wherein the metal is Nb. In an even further aspect, disclosed are thermoelectric ceramic oxide compositions comprising a metal doped $CaMnO_3$ having with a metal oxide grain boundary phase; wherein the metal is Yb. In a still further aspect, disclosed are thermoelectric ceramic oxide compositions comprising a metal doped $CaMnO_3$ having with a metal oxide grain boundary phase; wherein the metal is Dy. In a yet further aspect, disclosed are thermoelectric ceramic oxide compositions comprising a metal doped $CaMnO_3$ having with a metal oxide grain boundary phase; wherein the metal is Mo. In an even further aspect, disclosed are thermoelectric ceramic oxide compositions comprising a metal doped $CaMnO_3$ having with a metal oxide grain boundary phase; wherein the metal is W. In a still further aspect, disclosed are thermoelectric ceramic oxide compositions comprising a metal doped $CaMnO_3$ having with a metal oxide grain boundary phase; wherein the metal is Gd.

In various aspects, the present disclosure pertains to thermoelectric ceramic oxide compositions comprising $CaMnO_3$ doped with a first metal; and the $CaMnO_3$ doped with a first metal has a grain boundary phase comprising an oxide of a second metal. In a further aspect, disclosed are thermoelectric ceramic oxide compositions comprising $CaMnO_3$ doped with a first metal and having with a grain boundary phase comprising an oxide of a second metal; wherein the first metal is selected from group 13, group 14, group 15, group 16, or a rare earth element; and wherein the second metal is selected from a group 11 element. In a still further aspect, disclosed are thermoelectric ceramic oxide compositions comprising $CaMnO_3$ doped with a first metal and having with a grain boundary phase comprising an oxide of a second metal; wherein the first metal is selected from group 13, group 14, group 15, group 16, or a rare earth element; and wherein the second metal is Cu or Ag. In a yet further aspect, disclosed are thermoelectric ceramic oxide compositions comprising $CaMnO_3$ doped with a first metal and having with a grain boundary phase comprising an oxide of a second metal; wherein the first metal is selected from group 13, group 14, group 15, group 16, or a rare earth element; and wherein the second metal is Cu. In an even further aspect, disclosed are thermoelectric ceramic oxide compositions comprising $CaMnO_3$ doped with a first metal and having with a grain boundary phase comprising an oxide of a second metal; wherein the first metal is selected from group 13, group 14, group 15, group 16, or a rare earth element; and wherein the second metal is Ag.

In a still further aspect, disclosed are thermoelectric ceramic oxide compositions comprising $CaMnO_3$ doped with a first metal and having with a grain boundary phase comprising an oxide of a second metal; wherein the first metal is selected from Bi, Nb, Yb, Dy, Mo, W, and Gd; and wherein the second metal is a group 11 element. In a still further aspect, disclosed are thermoelectric ceramic oxide compositions comprising $CaMnO_3$ doped with a first metal and having with a grain boundary phase comprising an oxide of a second metal; wherein the first metal is selected from Bi, Nb, Yb, Dy, Mo, W, and Gd; and wherein the second metal is Cu or Ag. In a yet further aspect, disclosed are thermoelectric ceramic oxide compositions comprising $CaMnO_3$ doped with a first metal and having with a grain boundary phase comprising an oxide of a second metal; wherein the first metal is selected from Bi, Nb, Yb, Dy, Mo, W, and Gd; and wherein the second metal is Cu. In an even further aspect, disclosed are thermoelectric ceramic oxide compositions comprising $CaMnO_3$ doped with a first metal and having with a grain boundary phase comprising an oxide of a second metal; wherein the first metal is selected from Bi, Nb, Yb, Dy, Mo, W, and Gd; and wherein the second metal is Ag.

In a further aspect, the present disclosure pertains to thermoelectric ceramic oxide compositions comprising a composition having the chemical formula, $Ca_{1-x}M_xMnCu_yO_3$, wherein M is an element from group 13, group 14, group 15, group 16, or a rare earth element; wherein x is a number having a value from about 0 to about 0.5; and wherein y is a number having a value from about 0.01 to about 0.5. In still a further aspect, the present disclosure pertains to thermoelectric ceramic oxide compositions comprising a composition having the chemical formula, $Ca_{1-x}M_xMnCu_yO_3$, wherein M is an element from group 13, group 14, group 15, group 16, or a rare earth element; wherein x is a number having a value from about 0 to about 0.1; and wherein y is a number having a value from about 0.01 to about 0.2. In yet a further aspect, the present disclosure pertains to thermoelectric ceramic oxide compositions comprising a composition having the chemical formula, $Ca_{1-x}M_xMnCu_yO_3$, wherein M is an element from group 13, group 14, group 15, group 16, or a rare earth element; wherein x is a number having a value from about 0 to about 0.05; and wherein y is a number having a value from about 0.01 to about 0.05. In an even further aspect, the present disclosure pertains to thermoelectric ceramic oxide compositions comprising a composition having the chemical formula, $Ca_{1-x}M_xMnCu_yO_3$, wherein M is an element from group 13, group 14, group 15, group 16, or a rare earth element; wherein x is a number having a value of about 0, about 0.01, about 0.02, about 0.03, about 0.04, about 0.05, about 0.06, about 0.08, about 0.09, about 0.1, or any range comprising the foregoing values or any combination of the foregoing values; and wherein y is a number having a value of about 0, about 0.01, about 0.02, about 0.03, about 0.04, about 0.05, about 0.06, about 0.08, about 0.09, about 0.1, or any range comprising the foregoing values or any combination of the foregoing values. In various aspects, the present disclosure pertains to thermoelectric ceramic oxide compositions comprising a composition having the chemical formula, $Ca_{1-x}M_xMnCu_yO_3$, wherein M is an element from group 13, group 14, group 15, group 16, or a rare earth element; wherein x is a number having a value of about 0, 0.02, 0.03; and 0.04 wherein y is a number having a value of about 0, 0.02, or 0.04.

In a further aspect, the present disclosure pertains to thermoelectric ceramic oxide compositions comprising a composition having the chemical formula, $Ca_{1-x}M_xMnCu_yO_3$, wherein M is an element selected from Bi, Nb, Yb, Dy, Mo, W, and Gd; wherein x is a number having a value from about 0 to about 0.5; and wherein y is a number having a value from about 0.01 to about 0.5. In still a further aspect, the present disclosure pertains to thermoelectric ceramic oxide compositions comprising a composition having the chemical formula, $Ca_{1-x}M_xMnCu_yO_3$, wherein M is an element selected from Bi, Nb, Yb, Dy, Mo, W, and Gd; wherein x is a number having a value from about 0 to about 0.1; and wherein y is a number having a value from about 0.01 to about 0.2. In yet a further aspect, the present disclosure pertains to thermoelectric ceramic oxide compositions comprising a composition having the chemical formula, $Ca_{1-x}M_xMnCu_yO_3$, wherein M is an element selected from Bi, Nb, Yb, Dy, Mo, W, and Gd; wherein x is a number having a value from about 0 to about 0.05; and wherein y is a number having a value from about 0.01 to about 0.05. In an even further aspect, the present disclosure pertains to thermoelectric ceramic oxide compositions comprising a composition having the chemical formula, $Ca_{1-x}M_xMnCu_yO_3$, wherein M is an element selected from Bi, Nb, Yb, Dy, Mo, W, and Gd; wherein x is a number having a value of about 0, about 0.01, about 0.02, about 0.03, about 0.04, about 0.05, about 0.06, about 0.08, about 0.09, about 0.1, or any range comprising the foregoing values or any combination of the foregoing values; and wherein y is a number having a value of about 0, about 0.01, about 0.02, about 0.03, about 0.04, about 0.05, about 0.06, about 0.08, about 0.09, about 0.1, or any range comprising the foregoing values or any combination of the foregoing values. In various aspects, the present disclosure pertains to thermoelectric ceramic oxide compositions comprising a composition having the chemical formula, $Ca_{1-x}M_xMnCu_yO_3$, wherein M is an element selected from Bi, Nb, Yb, Dy, Mo, W, and Gd; wherein x is a number having a value of about 0, 0.02, 0.03; and 0.04 wherein y is a number having a value of about 0, 0.02, or 0.04.

In a further aspect, the present disclosure pertains to thermoelectric ceramic oxide compositions comprising a composition having the chemical formula, $Ca_{1-x}Bi_xMnCu_yO_3$, wherein x is a number having a value from about 0 to about 0.5 and wherein y is a number having a value from about 0.01 to about 0.5. In still a further aspect, the present disclosure pertains to thermoelectric ceramic oxide compositions comprising a composition having the chemical formula, $Ca_{1-x}Bi_xMnCu_yO_3$, wherein x is a number having a value from about 0 to about 0.1 and wherein y is a number having a value from about 0.01 to about 0.2. In yet a further aspect, the present disclosure pertains to thermoelectric ceramic oxide compositions comprising a composition having the chemical formula, $Ca_{1-x}Bi_xMnCu_yO_3$, wherein x is a number having a value from about 0 to about 0.05 and wherein y is a number having a value from about 0.01 to about 0.05. In an even further aspect, the present disclosure pertains to thermoelectric ceramic oxide compositions comprising a composition having the chemical formula, $Ca_{1-x}Bi_xMnCu_yO_3$, wherein x is a number having a value of about 0, about 0.01, about 0.02, about 0.03, about 0.04, about 0.05, about 0.06, about 0.08, about 0.09, about 0.1, or any range comprising the foregoing values or any combination of the foregoing values; and wherein y is a number having a value of about 0, about 0.01, about 0.02, about 0.03, about 0.04, about 0.05, about 0.06, about 0.08, about 0.09, about 0.1, or any range comprising the foregoing values or any combination of the foregoing values. In various aspects, the present disclosure pertains to thermoelectric ceramic oxide compositions comprising a composition having the chemical formula, $Ca_{1-x}Bi_xMnCu_yO_3$, wherein x is a number having a value of about 0, 0.02, 0.03, and 0.04 wherein y is a number having a value of about 0, 0.02, or 0.04.

In a further aspect, the present disclosure pertains to thermoelectric ceramic oxide compositions comprising a composition having the chemical formula, $Ca_{1-x}Nb_xMnCu_yO_3$, wherein x is a number having a value from about 0 to about 0.5 and wherein y is a number having a value from about 0.01 to about 0.5. In still a further aspect, the present disclosure pertains to thermoelectric ceramic oxide compositions comprising a composition having the chemical formula, $Ca_{1-x}Nb_xMnCu_yO_3$, wherein x is a number having a value from about 0 to about 0.1 and wherein y is a number having a value from about 0.01 to about 0.2. In yet a further aspect, the present disclosure pertains to thermoelectric ceramic oxide compositions comprising a composition having the chemical formula, $Ca_{1-x}Nb_xMnCu_yO_3$, wherein x is a number having a value from about 0 to about 0.05 and wherein y is a number having a value from about 0.01 to about 0.05. In an even further aspect, the present disclosure pertains to thermoelectric ceramic oxide compositions comprising a composition having the chemical formula, $Ca_{1-x}Nb_xMnCu_yO_3$, wherein x is a number having a value of about 0, about 0.01, about 0.02, about 0.03, about 0.04, about 0.05, about 0.06, about 0.08, about 0.09, about 0.1, or any range comprising the foregoing values or any combination of the foregoing values; and wherein y is a number having a value of about 0, about 0.01, about 0.02, about 0.03, about 0.04, about 0.05, about 0.06, about 0.08, about 0.09, about 0.1, or any range comprising the foregoing values or any combination of the foregoing values. In various aspects, the present disclosure pertains to thermoelectric ceramic oxide compositions comprising a composition having the chemical formula, $Ca_{1-x}Nb_xMnCu_yO_3$, wherein x is a number having a value of about 0, 0.02, 0.03, and 0.04 wherein y is a number having a value of about 0, 0.02, or 0.04.

In a further aspect, the present disclosure pertains to thermoelectric ceramic oxide compositions comprising a composition having the chemical formula, $Ca_{1-x}Yb_xMn$-

$Cu_yO_3$, wherein x is a number having a value from about 0 to about 0.5 and wherein y is a number having a value from about 0.01 to about 0.5. In still a further aspect, the present disclosure pertains to thermoelectric ceramic oxide compositions comprising a composition having the chemical formula, $Ca_{1-x}Yb_xMnCu_yO_3$, wherein x is a number having a value from about 0 to about 0.1 and wherein y is a number having a value from about 0.01 to about 0.2. In yet a further aspect, the present disclosure pertains to thermoelectric ceramic oxide compositions comprising a composition having the chemical formula, $Ca_{1-x}Yb_xMnCu_yO_3$, wherein x is a number having a value from about 0 to about 0.05 and wherein y is a number having a value from about 0.01 to about 0.05. In an even further aspect, the present disclosure pertains to thermoelectric ceramic oxide compositions comprising a composition having the chemical formula, $Ca_{1-x}Yb_xMnCu_yO_3$, wherein x is a number having a value of about 0, about 0.01, about 0.02, about 0.03, about 0.04, about 0.05, about 0.06, about 0.08, about 0.09, about 0.1, or any range comprising the foregoing values or any combination of the foregoing values; and wherein y is a number having a value of about 0, about 0.01, about 0.02, about 0.03, about 0.04, about 0.05, about 0.06, about 0.08, about 0.09, about 0.1, or any range comprising the foregoing values or any combination of the foregoing values. In various aspects, the present disclosure pertains to thermoelectric ceramic oxide compositions comprising a composition having the chemical formula, $Ca_{1-x}Yb_xMnCu_yO_3$, wherein x is a number having a value of about 0, 0.02, 0.03, and 0.04 wherein y is a number having a value of about 0, 0.02, or 0.04.

In a further aspect, the present disclosure pertains to thermoelectric ceramic oxide compositions comprising a composition having the chemical formula, $Ca_{1-x}Dy_xMnCu_yO_3$, wherein x is a number having a value from about 0 to about 0.5 and wherein y is a number having a value from about 0.01 to about 0.5. In still a further aspect, the present disclosure pertains to thermoelectric ceramic oxide compositions comprising a composition having the chemical formula, $Ca_{1-x}Dy_xMnCu_yO_3$, wherein x is a number having a value from about 0 to about 0.1 and wherein y is a number having a value from about 0.01 to about 0.2. In yet a further aspect, the present disclosure pertains to thermoelectric ceramic oxide compositions comprising a composition having the chemical formula, $Ca_{1-x}Dy_xMnCu_yO_3$, wherein x is a number having a value from about 0 to about 0.05 and wherein y is a number having a value from about 0.01 to about 0.05. In an even further aspect, the present disclosure pertains to thermoelectric ceramic oxide compositions comprising a composition having the chemical formula, $Ca_{1-x}Dy_xMnCu_yO_3$, wherein x is a number having a value of about 0, about 0.01, about 0.02, about 0.03, about 0.04, about 0.05, about 0.06, about 0.08, about 0.09, about 0.1, or any range comprising the foregoing values or any combination of the foregoing values; and wherein y is a number having a value of about 0, about 0.01, about 0.02, about 0.03, about 0.04, about 0.05, about 0.06, about 0.08, about 0.09, about 0.1, or any range comprising the foregoing values or any combination of the foregoing values. In various aspects, the present disclosure pertains to thermoelectric ceramic oxide compositions comprising a composition having the chemical formula, $Ca_{1-x}Dy_xMnCu_yO_3$, wherein x is a number having a value of about 0, 0.02, 0.03, and 0.04 wherein y is a number having a value of about 0, 0.02, or 0.04.

In a further aspect, the present disclosure pertains to thermoelectric ceramic oxide compositions comprising a composition having the chemical formula, $Ca_{1-x}Mo_xMnCu_yO_3$, wherein x is a number having a value from about 0 to about 0.5 and wherein y is a number having a value from about 0.01 to about 0.5. In still a further aspect, the present disclosure pertains to thermoelectric ceramic oxide compositions comprising a composition having the chemical formula, $Ca_{1-x}Mo_xMnCu_yO_3$, wherein x is a number having a value from about 0 to about 0.1 and wherein y is a number having a value from about 0.01 to about 0.2. In yet a further aspect, the present disclosure pertains to thermoelectric ceramic oxide compositions comprising a composition having the chemical formula, $Ca_{1-x}Mo_xMnCu_yO_3$, wherein x is a number having a value from about 0 to about 0.05 and wherein y is a number having a value from about 0.01 to about 0.05. In an even further aspect, the present disclosure pertains to thermoelectric ceramic oxide compositions comprising a composition having the chemical formula, $Ca_{1-x}Mo_xMnCu_yO_3$, wherein x is a number having a value of about 0, about 0.01, about 0.02, about 0.03, about 0.04, about 0.05, about 0.06, about 0.08, about 0.09, about 0.1, or any range comprising the foregoing values or any combination of the foregoing values; and wherein y is a number having a value of about 0, about 0.01, about 0.02, about 0.03, about 0.04, about 0.05, about 0.06, about 0.08, about 0.09, about 0.1, or any range comprising the foregoing values or any combination of the foregoing values. In various aspects, the present disclosure pertains to thermoelectric ceramic oxide compositions comprising a composition having the chemical formula, $Ca_{1-x}Mo_xMnCu_yO_3$, wherein x is a number having a value of about 0, 0.02, 0.03, and 0.04 wherein y is a number having a value of about 0, 0.02, or 0.04.

In a further aspect, the present disclosure pertains to thermoelectric ceramic oxide compositions comprising a composition having the chemical formula, $Ca_{1-x}W_xMnCu_yO_3$, wherein x is a number having a value from about 0 to about 0.5 and wherein y is a number having a value from about 0.01 to about 0.5. In still a further aspect, the present disclosure pertains to thermoelectric ceramic oxide compositions comprising a composition having the chemical formula, $Ca_{1-x}W_xMnCu_yO_3$, wherein x is a number having a value from about 0 to about 0.1 and wherein y is a number having a value from about 0.01 to about 0.2. In yet a further aspect, the present disclosure pertains to thermoelectric ceramic oxide compositions comprising a composition having the chemical formula, $Ca_{1-x}W_xMnCu_yO_3$, wherein x is a number having a value from about 0 to about 0.05 and wherein y is a number having a value from about 0.01 to about 0.05. In an even further aspect, the present disclosure pertains to thermoelectric ceramic oxide compositions comprising a composition having the chemical formula, $Ca_{1-x}W_xMnCu_yO_3$, wherein x is a number having a value of about 0, about 0.01, about 0.02, about 0.03, about 0.04, about 0.05, about 0.06, about 0.08, about 0.09, about 0.1, or any range comprising the foregoing values or any combination of the foregoing values; and wherein y is a number having a value of about 0, about 0.01, about 0.02, about 0.03, about 0.04, about 0.05, about 0.06, about 0.08, about 0.09, about 0.1, or any range comprising the foregoing values or any combination of the foregoing values. In various aspects, the present disclosure pertains to thermoelectric ceramic oxide compositions comprising a composition having the chemical formula, $Ca_{1-x}W_xMnCu_yO_3$, wherein x is a number having a value of about 0, 0.02, 0.03, and 0.04 wherein y is a number having a value of about 0, 0.02, or 0.04.

In a further aspect, the present disclosure pertains to thermoelectric ceramic oxide compositions comprising a composition having the chemical formula, $Ca_{1-x}Gd_xMnCu_yO_3$, wherein x is a number having a value from about 0 to about 0.5 and wherein y is a number having a value from about 0.01 to about 0.5. In still a further aspect, the present disclosure pertains to thermoelectric ceramic oxide compositions comprising a composition having the chemical formula, $Ca_{1-x}Gd_xMnCu_yO_3$, wherein x is a number having a value from about 0 to about 0.1 and wherein y is a number having a value from about 0.01 to about 0.2. In yet a further aspect, the present disclosure pertains to thermoelectric ceramic oxide compositions comprising a composition having the chemical formula, $Ca_{1-x}Gd_xMnCu_yO_3$, wherein x is a number having a value from about 0 to about 0.05 and wherein y is a number having a value from about 0.01 to about 0.05. In an even further aspect, the present disclosure pertains to thermoelectric ceramic oxide compositions comprising a composition having the chemical formula, $Ca_{1-x}Gd_xMnCu_yO_3$, wherein x is a number having a value of about 0, about 0.01, about 0.02, about 0.03, about 0.04, about 0.05, about 0.06, about 0.08, about 0.09, about 0.1, or any range comprising the foregoing values or any combination of the foregoing values; and wherein y is a number having a value of about 0, about 0.01, about 0.02, about 0.03, about 0.04, about 0.05, about 0.06, about 0.08, about 0.09, about 0.1, or any range comprising the foregoing values or any combination of the foregoing values. In various aspects, the present disclosure pertains to thermoelectric ceramic oxide compositions comprising a composition having the chemical formula, $Ca_{1-x}Gd_xMnCu_yO_3$, wherein x is a number having a value of about 0, 0.02, 0.03, and 0.04 wherein y is a number having a value of about 0, 0.02, or 0.04.

In comparison with the baseline of pristine $CaMnO_3$, Bi substitution of Ca in the $Ca_{1-x}Bi_xMnO_3$ samples decreases both the electrical resistivity and Seebeck coefficient. As described herein below in the Examples, when the Cu is further introduced into the Bi doped $Ca_{1-x}Bi_xMnO_3$ samples, the $Ca_{1-x}Bi_xMnCu_yO_3$ samples exhibit higher Seebeck coefficient and lower electrical resistivity. As exemplified below, among the bulk scale oxide with different chemistry, a sample having the formula $Ca_{2.97}Bi_{0.03}MnCu_{0.04}O_3$ was observed to have a particularly enhanced electrical power factor of 2.4 mWm$^{-1}$K$^{-2}$ at 337K, among the highest values compared to conventionally available materials. As discussed herein below, the sample having the formula $Ca_{2.97}Bi_{0.03}MnCu_{0.04}O_3$, benefiting from the low electrical resistivity and relatively high Seebeck coefficient, was observed to have an overall energy conversion efficiency figure of merit, ZT, of 0.67 at 773 K. This ZT of 0.67 is a factor of two greater than the highest reported ZT value (1) in the literature for a $CaMnO_3$ material synthesized using various methods with various chemistry modifications/doping. The ZT for the $Ca_{2.97}Bi_{0.03}MnCu_{0.04}O_3$ sample exhibits a high plateau from room temperature to 1083 K. Moreover, as discussed herein below in the Examples, nanostructure examination revealed that the Bi formed a solid solution in the $CaMnO_3$ lattice. By contrast, the Cu formed a secondary phase of CuO at the grain boundaries of $CaMnO_3$. At the high temperature that the oxide pellets are sintered, the CuO is liquid phase.

In various aspects, the disclosed thermoelectric ceramic compositions are sintered, and have a sintered density of about 3 g/cm$^3$ to about 5 g/cm$^3$. In a further aspect, the disclosed thermoelectric ceramic compositions are sintered, and have a sintered density of about 3.1 g/cm$^3$ to about 4.9 g/cm$^3$. In a still further aspect, the disclosed thermoelectric ceramic compositions are sintered, and have a sintered density of about 3.2 g/cm$^3$ to about 4.8 g/cm$^3$. In a yet further aspect, the disclosed thermoelectric ceramic compositions are sintered, and have a sintered density of about 3.3 g/cm$^3$ to about 4.7 g/cm$^3$. In an even further aspect, the disclosed thermoelectric ceramic compositions are sintered, and have a sintered density of about 3.4 g/cm$^3$ to about 4.6 g/cm$^3$. In a still further aspect, the disclosed thermoelectric ceramic compositions are sintered, and have a sintered density of about 3.5 g/cm$^3$ to about 4.6 g/cm$^3$. In a yet further aspect, the disclosed thermoelectric ceramic compositions are sintered, and have a sintered density of about 3.6 g/cm$^3$ to about 4.6 g/cm$^3$.

Without wishing to be bound by a particular theory, it is believed that the surprising enhancements in electrical power factor and the overall ZT in the disclosed thermoelectric ceramic materials can be attributed to the synergistic effect of decreasing the carrier concentration to increase the Seebeck coefficient and simultaneously increasing the carrier mobility through the existence of CuO phase at the grain boundaries. The CuO wetting phase segregated at the grain boundaries may also provide additional scattering centers for the phonons to further reduce the thermal conductivity.

In the aspects of the invention described herein, a significant increase in power factor in $CaMnO_3$ materials was achieved through a synergistic approach of dopant substitution in the lattice and secondary liquid phase of CuO segregation at the grain boundaries of polycrystalline ceramics. The Bi substitution of Ca in the $CaMnO_3$ lattice results in the concurrent decrease of both the Seebeck coefficient and the electrical resistivity, producing an overall moderate increase in power factor. When the CuO liquid phase is introduced to grain boundaries of Bi-doped $CaMnO_3$ ceramics, it promotes the thermoelectric parameters (S, σ) decoupling, and leads to the dramatic decrease of the electrical resistivity and simultaneous increase of Seebeck coefficient. The overall energy conversion efficiency figure of merit ZT for the best performed sample with the chemistry of $Ca_{1-x}Bi_xMnCu_yO_3$ is 0.67 at 773 K.

Overall, benefiting from the significantly increased power factor and reduced thermal conductivity, the sample has a high Figure Merit of ZT=0.67 at 773K. The metal oxide ceramics aspects of the present disclosure are developed using the low cost conventional processing methods for ceramics, without the requiring costly microfabrication processing. The disclosed thermoelectric $CaMnO_3$ oxide ceramics demonstrate the effective approach of decoupling the Seebeck coefficient with electrical conductivity to significantly increase the overall power factor. The power factor $S^2/\rho$ of sample $Ca_{2.97}Bi_{0.03}MnCu_yO_3$ is 2.4 mW·m$^{-1}$K$^{-2}$ at 377 K, and the ZT is 0.67 at 773 K. The ZT value of 0.67 is factor of 2 of that reported in the literatures of ZT~0.3. Such dramatic power factor and figure of merit improvements were achieved through the synergistic approach of Bi substitution in the $CaMnO_3$ lattice and the formation of CuO liquid phase at the grain boundaries. The disclosed thermoelectric ceramic materials provides a novel approach to engineering the grain boundaries in order to tailor electrical power factor and improve the thermoelectric performance of perovskite $CaMnO_3$.

The disclosed thermoelectric oxides also exhibit a high plateau of the ZT values from room temperature to 1073 K, and makes it versatile for thermoelectric application over a wide temperature range. From room temperature to 773 K, the ZT of the n-type bulk oxide aspect is higher than that from the state-of-the art thermoelectric SiGe bulk alloys. In comparison with SiGe, the thermoelectric oxides comprising the aspects of this invention can function in the air directly from room temperature to 1300° C. (or 1573 K). By contrast, SiGe materials need to operate in a non-oxidizing environment to prevent oxidation when it is used in high temperature applications.

In other aspects of the present disclosure, the dopant bismuth in the ceramic oxide may be substituted with cerium, ytterbium, niobium or lutetium without significant loss of thermoelectric performance. In yet other aspects of the present disclosure, the grain boundary liquid phase CuO may be substituted with another metal oxide or metal (such as silver oxide or silver as non-limiting examples) without significant loss of thermoelectric performance.

In various aspects, the disclosed thermoelectric ceramic oxide compositions have CuO at the grain boundaries, wherein the boundaries are discrete or continuous. In a further aspect, the thickness of the CuO at the grain boundary is about 100 nm to about 20 μm, any value or set of intermediate values encompassed by the foregoing values, or any sub-range within the foregoing values. In a further aspect, the thickness of the CuO at the grain boundary is about 1 μm to about 5 μm.

In various aspects, the disclosed thermoelectric ceramic oxide compositions have a power factor in the range of about $0.8\ mWm^{-1}K^{-2}$ to about $4.0\ mWm^{-1}K^{-2}$ in the temperature range of from about 298K to about 1073K, any value or set of intermediate values encompassed by the foregoing values, or any sub-range within the foregoing values. In a further, the disclosed thermoelectric ceramic oxide compositions have a power factor in the range of about 0.8 $mWm^{-1}K^{-2}$ to about 2.5 $mWm^{-1}K^{-2}$ in the temperature range of from about 298K to about 1073K, any value or set of intermediate values encompassed by the foregoing values, or any sub-range within the foregoing values.

In various aspects, the disclosed thermoelectric ceramic oxide compositions have a ZT value in the range of about 0.2 to about 0.7 in the temperature range of from about 298K to about 1073K, any value or set of intermediate values encompassed by the foregoing values, or any sub-range within the foregoing values.

In various aspects, the disclosed thermoelectric ceramic oxide compositions have a electrical resistivity value in the range of about 5 μΩm to about 300 μΩm in the temperature range of from about 298K to about 1073K, any value or set of intermediate values encompassed by the foregoing values, or any sub-range within the foregoing values.

In various aspects, the disclosed thermoelectric ceramic oxide compositions have a Seeback coefficient in the range of about $-100\ \mu VK^{-1}$ to about $-600\ \mu VK^{-1}$ in the temperature range of from about 298K to about 1073K, any value or set of intermediate values encompassed by the foregoing values, or any sub-range within the foregoing values.

Methods of Making of Thermoelectric Ceramic Oxide Compositions

In one aspect, the disclosure relates to methods for making the thermoelectric ceramic oxide materials. In a further aspect, disclosed are methods of making a high performance, thermoelectric ceramic oxide comprising the steps of: dissolving in water the following: citric acid, ethylene glycol, polyethylene glycol, nitric acid, a copper salt, a calcium nitrate salt, a manganese nitrate salt, and a salt comprising a cation formed from an element selected from group 13, group 14, group 15, group 16, or a rare earth element; stirring the solution under heat to form a gel; converting the gel to ash by applying heat to the gel; grinding the ash; calcining the ground ash to form a powder; and pressing the powder to form a pellet; and sintering the pellet to form a thermoelectric ceramic oxide.

In a further aspect, disclosed are methods of making a high performance, thermoelectric ceramic oxide comprising the steps of: dissolving in water the following: citric acid, ethylene glycol, polyethylene glycol, nitric acid, a copper nitrate, a calcium nitrate salt, a manganese nitrate salt, and a salt comprising a cation formed from an element selected from Bi, Nb, Yb, Dy, Mo, W, and Gd; stirring the solution under heat to form a gel; converting the gel to ash by applying heat to the gel; grinding the ash; calcining the ground ash to form a powder; and pressing the powder to form a pellet; and sintering the pellet to form a thermoelectric ceramic oxide.

In a further aspect, disclosed are methods of making a high performance, thermoelectric ceramic oxide comprising the steps of: dissolving citric acid, ethylene glycol, polyethylene glycol, nitric acid, $Bi(NO_3)_3.5H_2O$, $Ca(NO_3)_2.4H_2O$, $Mn(NO_3)_2.6H_2O$, and $Cu(NO_3)_2$ in water to form a solution; stirring the solution under heat to form a gel; converting the gel to ash by applying heat to the gel; grinding the ash; calcining the ground ash to form a powder; and pressing the powder to form a pellet; and sintering the pellet to form a thermoelectric ceramic oxide with a figure of merit greater than 0.3.

In a further aspect, disclosed are methods of making a high performance, thermoelectric ceramic oxide comprising the steps of: dissolving citric acid, ethylene glycol, polyethylene glycol, nitric acid, Nb salt, $Ca(NO_3)_2.4H_2O$, Mn$(NO_3)_2.6H_2O$, and $Cu(NO_3)_2$ in water to form a solution; stirring the solution under heat to form a gel; converting the gel to ash by applying heat to the gel; grinding the ash; calcining the ground ash to form a powder; and pressing the powder to form a pellet; and sintering the pellet to form a thermoelectric ceramic oxide with a figure of merit greater than 0.3.

In a further aspect, disclosed are methods of making a high performance, thermoelectric ceramic oxide comprising the steps of: dissolving citric acid, ethylene glycol, polyethylene glycol, nitric acid, Yb salt, $Ca(NO_3)_2.4H_2O$, Mn $(NO_3)_2.6H_2O$, and $Cu(NO_3)_2$ in water to form a solution; stirring the solution under heat to form a gel; converting the gel to ash by applying heat to the gel; grinding the ash; calcining the ground ash to form a powder; and pressing the powder to form a pellet; and sintering the pellet to form a thermoelectric ceramic oxide with a figure of merit greater than 0.3.

In a further aspect, disclosed are methods of making a high performance, thermoelectric ceramic oxide comprising the steps of: dissolving citric acid, ethylene glycol, polyethylene glycol, nitric acid, Dy salt, $Ca(NO_3)_2.4H_2O$, Mn $(NO_3)_2.6H_2O$, and $Cu(NO_3)_2$ in water to form a solution; stirring the solution under heat to form a gel; converting the gel to ash by applying heat to the gel; grinding the ash; calcining the ground ash to form a powder; and pressing the powder to form a pellet; and sintering the pellet to form a thermoelectric ceramic oxide with a figure of merit greater than 0.3.

In a further aspect, disclosed are methods of making a high performance, thermoelectric ceramic oxide comprising the steps of: dissolving citric acid, ethylene glycol, polyethylene glycol, nitric acid, Mo salt, $Ca(NO_3)_2.4H_2O$, $Mn(NO_3)_2.6H_2O$, and $Cu(NO_3)_2$ in water to form a solution; stirring the solution under heat to form a gel; converting the gel to ash by applying heat to the gel; grinding the ash; calcining the ground ash to form a powder; and pressing the powder to form a pellet; and sintering the pellet to form a thermoelectric ceramic oxide with a figure of merit greater than 0.3.

In a further aspect, disclosed are methods of making a high performance, thermoelectric ceramic oxide comprising the steps of: dissolving citric acid, ethylene glycol, polyethylene glycol, nitric acid, W salt, $Ca(NO_3)_2.4H_2O$, Mn (NO$_3$)$_2$.6H$_2$O, and Cu(NO$_3$)$_2$ in water to form a solution; stirring the solution under heat to form a gel; converting the gel to ash by applying heat to the gel; grinding the ash; calcining the ground ash to form a powder; and pressing the powder to form a pellet; and sintering the pellet to form a thermoelectric ceramic oxide with a figure of merit greater than 0.3.

In a further aspect, disclosed are methods of making a high performance, thermoelectric ceramic oxide comprising the steps of: dissolving citric acid, ethylene glycol, polyethylene glycol, nitric acid, Gd salt, Ca(NO$_3$)$_2$.4H$_2$O, Mn(NO$_3$)$_2$.6H$_2$O, and Cu(NO$_3$)$_2$ in water to form a solution; stirring the solution under heat to form a gel; converting the gel to ash by applying heat to the gel; grinding the ash; calcining the ground ash to form a powder; and pressing the powder to form a pellet; and sintering the pellet to form a thermoelectric ceramic oxide with a figure of merit greater than 0.3.

In a further aspect, the present disclosure pertains to methods of making a high performance, thermoelectric ceramic oxide comprising the steps of: dissolving citric acid, ethylene glycol, polyethylene glycol, nitric acid, a copper salt a calcium nitrate salt, a manganese nitrate salt, a salt comprising a cation formed from an element selected from group 13, group 14, group 15, group 16, or a rare earth element; and silver nitrate in water to form a solution; stirring the solution under heat to form a gel; converting the gel to ash by applying heat to the gel; grinding the ash; calcining the ground ash to form a powder; and pressing the powder to form a pellet; and sintering the pellet to form a thermoelectric ceramic oxide with a figure of merit greater than 0.3.

In a further aspect, the present disclosure pertains to methods of making a high performance, thermoelectric ceramic oxide comprising the steps of: dissolving citric acid, ethylene glycol, polyethylene glycol, nitric acid, a copper salt a calcium nitrate salt, a manganese nitrate salt, a salt comprising a cation formed from an element selected from Bi, Nb, Yb, Dy, Mo, W, and Gd; and silver nitrate in water to form a solution; stirring the solution under heat to form a gel; converting the gel to ash by applying heat to the gel; grinding the ash; calcining the ground ash to form a powder; and pressing the powder to form a pellet; and sintering the pellet to form a thermoelectric ceramic oxide with a figure of merit greater than 0.3.

In a further aspect, the present disclosure pertains to methods of making a high performance, thermoelectric ceramic oxide comprising the steps of: dissolving citric acid, ethylene glycol, polyethylene glycol, nitric acid, a Bi salt, Ca(NO$_3$)$_2$.4H$_2$O, Mn(NO$_3$)$_2$.6H$_2$O, and Cu(NO$_3$)$_2$, and silver nitrate in water to form a solution; stirring the solution under heat to form a gel; converting the gel to ash by applying heat to the gel; grinding the ash; calcining the ground ash to form a powder; and pressing the powder to form a pellet; and sintering the pellet to form a thermoelectric ceramic oxide with a figure of merit greater than 0.3.

In a further aspect, the present disclosure pertains to methods of making a high performance, thermoelectric ceramic oxide comprising the steps of: dissolving citric acid, ethylene glycol, polyethylene glycol, nitric acid, a Nb salt, Ca(NO$_3$)$_2$.4H$_2$O, Mn(NO$_3$)$_2$.6H$_2$O, and Cu(NO$_3$)$_2$, and silver nitrate in water to form a solution; stirring the solution under heat to form a gel; converting the gel to ash by applying heat to the gel; grinding the ash; calcining the ground ash to form a powder; and pressing the powder to form a pellet; and sintering the pellet to form a thermoelectric ceramic oxide with a figure of merit greater than 0.3.

In a further aspect, the present disclosure pertains to methods of making a high performance, thermoelectric ceramic oxide comprising the steps of: dissolving citric acid, ethylene glycol, polyethylene glycol, nitric acid, a Yb salt, Ca(NO$_3$)$_2$.4H$_2$O, Mn(NO$_3$)$_2$.6H$_2$O, and Cu(NO$_3$)$_2$, and silver nitrate in water to form a solution; stirring the solution under heat to form a gel; converting the gel to ash by applying heat to the gel; grinding the ash; calcining the ground ash to form a powder; and pressing the powder to form a pellet; and sintering the pellet to form a thermoelectric ceramic oxide with a figure of merit greater than 0.3.

In a further aspect, the present disclosure pertains to methods of making a high performance, thermoelectric ceramic oxide comprising the steps of: dissolving citric acid, ethylene glycol, polyethylene glycol, nitric acid, a Dy salt, Ca(NO$_3$)$_2$.4H$_2$O, Mn(NO$_3$)$_2$.6H$_2$O, and Cu(NO$_3$)$_2$, and a metal nitrate in water to form a solution; stirring the solution under heat to form a gel; converting the gel to ash by applying heat to the gel; grinding the ash; calcining the ground ash to form a powder; and pressing the powder to form a pellet; and sintering the pellet to form a thermoelectric ceramic oxide with a figure of merit greater than 0.3.

In a further aspect, the present disclosure pertains to methods of making a high performance, thermoelectric ceramic oxide comprising the steps of: dissolving citric acid, ethylene glycol, polyethylene glycol, nitric acid, a Mo salt, Ca(NO$_3$)$_2$.4H$_2$O, Mn(NO$_3$)$_2$.6H$_2$O, and Cu(NO$_3$)$_2$, and silver nitrate in water to form a solution; stirring the solution under heat to form a gel; converting the gel to ash by applying heat to the gel; grinding the ash; calcining the ground ash to form a powder; and pressing the powder to form a pellet; and sintering the pellet to form a thermoelectric ceramic oxide with a figure of merit greater than 0.3.

In a further aspect, the present disclosure pertains to methods of making a high performance, thermoelectric ceramic oxide comprising the steps of: dissolving citric acid, ethylene glycol, polyethylene glycol, nitric acid, a W salt, Ca(NO$_3$)$_2$.4H$_2$O, Mn(NO$_3$)$_2$.6H$_2$O, and Cu(NO$_3$)$_2$, and silver nitrate in water to form a solution; stirring the solution under heat to form a gel; converting the gel to ash by applying heat to the gel; grinding the ash; calcining the ground ash to form a powder; and pressing the powder to form a pellet; and sintering the pellet to form a thermoelectric ceramic oxide with a figure of merit greater than 0.3.

In a further aspect, the present disclosure pertains to methods of making a high performance, thermoelectric ceramic oxide comprising the steps of: dissolving citric acid, ethylene glycol, polyethylene glycol, nitric acid, a Gd salt, Ca(NO$_3$)$_2$.4H$_2$O, Mn(NO$_3$)$_2$.6H$_2$O, and Cu(NO$_3$)$_2$, and silver nitrate in water to form a solution; stirring the solution under heat to form a gel; converting the gel to ash by applying heat to the gel; grinding the ash; calcining the ground ash to form a powder; and pressing the powder to form a pellet; and sintering the pellet to form a thermoelectric ceramic oxide with a figure of merit greater than 0.3.

In a further aspect, the present disclosure pertains to methods of making a high performance, thermoelectric ceramic oxide comprising the steps of: dissolving citric acid, ethylene glycol, polyethylene glycol, nitric acid, Bi(NO$_3$)$_3$.5H$_2$O, Ca(NO$_3$)$_2$.4H$_2$O, Mn(NO$_3$)$_2$.6H$_2$O, and Cu(NO$_3$)$_2$, and a metal nitrate in water to form a solution; stirring the solution under heat to form a gel; converting the gel to ash by applying heat to the gel; grinding the ash; calcining the ground ash to form a powder; and pressing the powder to form a pellet; and sintering the pellet to form a thermoelectric ceramic oxide with a figure of merit greater than 0.3. In a still further aspect, the metal nitrate is silver nitrate.

In a further aspect, the present disclosure pertains to methods of making a high performance, thermoelectric ceramic oxide comprising the steps of: doping a ceramic oxide formulation with a first metal and a second metal in a sol-gel process resulting in a gel; heating the gel to form an ash-based powder; compressing the ash-based powder into a pellet; and sintering the pellet to form the high performance, thermoelectric ceramic oxide with a grain boundary phase that comprises an oxide of the second metal.

In a further aspect, disclosed are methods of making a high performance, thermoelectric ceramic oxide comprising the steps of: doping a ceramic oxide formulation with a first metal and a second metal in a sol-gel process resulting in a gel; heating the gel to form an ash-based powder; compressing the ash-based powder into a pellet; and sintering the pellet to form the high performance, thermoelectric ceramic oxide with a grain boundary phase that comprises an oxide of the second metal; wherein the high performance, ceramic oxide has the molecular formula $Ca_{1-x}Bi_xMnCu_yO_3$ wherein x is one of the values consisting of 0.02, 0.03 and 0.04, and y is one of the values consisting of 0.02 and 0.04. In a still further aspect, the first metal is bismuth and second metal is copper.

In a further aspect, the disclosed methods of making a high performance, thermoelectric ceramic oxide comprises as a first step formation of a gel by dissolution in water of metal salt at a suitable temperature for a suitable period of time, wherein the metal salt is a salt of an element selected from group 13, group 14, group 15, group 16, or a rare earth element. In a still further aspect, the disclosed methods of making a high performance, thermoelectric ceramic oxide comprises as a first step formation of a gel by dissolution in water of metal salt at a suitable temperature for a suitable period of time, wherein the metal salt is a salt of an element selected from Bi, Nb, Yb, Dy, Mo, W, and Gd. In a further aspect, the disclosed methods of making a high performance, thermoelectric ceramic oxide comprises as a first step formation of a gel by dissolution in water of metal nitrate salt at a suitable temperature for a suitable period of time, wherein the metal nitrate salt comprises a cation formed from an element selected from group 13, group 14, group 15, group 16, or a rare earth element. In a still further aspect, the disclosed methods of making a high performance, thermoelectric ceramic oxide comprises as a first step formation of a gel by dissolution in water of metal nitrate salt at a suitable temperature for a suitable period of time, wherein the metal nitrate salt comprises a cation formed from an element selected from Bi, Nb, Yb, Dy, Mo, W, and Gd.

In a further aspect, the suitable temperature in the first step is a temperature from about 290 K to about 380 K. In a still further aspect, the suitable temperature in the first step is a temperature from about 291 K to about 379 K. In a yet further aspect the suitable temperature in the first step is a temperature from about 292 K to about 378 K. In a still further aspect, the suitable temperature in the first step is a temperature from about 293 K to about 377 K. In a yet further aspect, the suitable temperature in the first step is a temperature from about 294 K to about 376 K. In a still further aspect, the suitable temperature in the first step is a temperature from about 295 K to about 375 K. In a yet further aspect, the suitable temperature in the first step is a temperature from about 296 K to about 374 K. In a still further aspect, the suitable temperature in the first step is a temperature from about 297 K to about 373 K. In a yet further aspect, the suitable temperature in the first step is a temperature from about 298 K to about 373 K. In an even further aspect, the suitable temperature in the first step is a temperature of about 290 K, about 295 K, about 300 K, about 305 K, about 310 K, about 315 K, about 320 K, about 325 K, about 330 K, about 335 K, about 340 K, about 345 K, about 350 K, about 355 K, about 360 K, about 365 K, about 370 K, about 375 K, a range encompassed by any of the foregoing values, any combination of the foregoing values, or any set of intermediate values encompassed by a range comprising the foregoing values.

In a further aspect, the suitable time in the first step is a time from about 10 min to about 24 h. In a further aspect, the suitable time in the first step is a time from about 1 h, about 2 h, about 3 h, about 4 h, about 5 h, about 6 h, about 7 h, about 8 h, about 9 h, about 10 h, about 11 h, about 12 h, about 13 h, about 14 h, about 15 h, about 16 h, about 17 h, about 18 h, about 19 h, about 20 h, about 21 h, about 22 h, about 23 h, about 24 h, a range encompassed by any of the foregoing values, any combination of the foregoing values, or any set of intermediate values encompassed by a range comprising the foregoing values.

In a further aspect, the disclosed methods of making a high performance, thermoelectric ceramic oxide comprises as a second step ashing of the gel formed in the first step carried out at a suitable temperature. In a still further aspect, ashing of the gel forme in the first step is carried out a temperature of about 630 K to about 930 K. In a yet further aspect, ashing of the gel forme in the first step is carried out a temperature of about 630 K, about 640 K, about 650 K, about 660 K, about 670 K, about 680 K, about 690 K, about 700 K, about 710 K, about 720 K, about 730 K, about 740 K, about 750 K, about 760 K, about 770 K, about 780 K, about 790 K, about 800 K, about 810 K, about 820 K, about 830 K, about 840 K, about 850 K, about 860 K, about 870 K, about 880 K, about 890 K, about 900 K, about 910 K, about 920 K, about 930 K, a range encompassed by any of the foregoing values, any combination of the foregoing values, or any set of intermediate values encompassed by a range comprising the foregoing values.

In a further aspect, the disclosed methods of making a high performance, thermoelectric ceramic oxide comprises as a third step grinding the ashed material formed in the second step, thereby forming a ground material, and then calcining the ground material for an suitable period of time at a suitable temperature, thereby forming a precursor powder. In a still further aspect, grinding can be carried out by a suitable apparatus, such as a ball mill. In a yet further aspect, the calcining can be carried out in a suitable apparatus, such as a furnace or tube furnace.

In a further aspect, the suitable temperature for calcining is about 1010 K to about 1350 K, a range encompassed by any of the foregoing values, any combination of the foregoing values, or any set of intermediate values encompassed by a range comprising the foregoing values.

In a further aspect, the suitable period of time for calcining is a time from about 10 min to about 24 h. In a further aspect, the suitable time in the third step is a time from about 1 h, about 2 h, about 3 h, about 4 h, about 5 h, about 6 h, about 7 h, about 8 h, about 9 h, about 10 h, about 11 h, about 12 h, about 13 h, about 14 h, about 15 h, about 16 h, about 17 h, about 18 h, about 19 h, about 20 h, about 21 h, about 22 h, about 23 h, about 24 h, a range encompassed by any of the foregoing values, any combination of the foregoing values, or any set of intermediate values encompassed by a range comprising the foregoing values.

In a further aspect, the disclosed methods of making a high performance, thermoelectric ceramic oxide comprises as a fourth step pressing of the powder from the third step into a pellet at a suitable temperature for a suitable period of time under a suitable pressure. In a still further aspect, the disclosed methods of making a high performance, thermoelectric ceramic oxide comprises as a fourth step pressing of the powder from the third step into a pellet at a temperature of about 298 K to about 373 K for a period of about 1 min to about 30 min at pressure of about 0.1 GPa to about 2 GPa.

In a further aspect, the suitable pressure used in the fourth step is about 0.1 GPa, about 0.2 GPa, about 0.3 GPa, about 0.4 GPa, about 0.5 GPa, about 0.6 GPa, about 0.7 GPa, about 0.8 GPa, about 0.9 GPa, about 1.0 GPa, 1.1 GPa, about 1.2 GPa, about 1.3 GPa, about 1.4 GPa, about 1.5 GPa, about 1.6 GPa, about 1.7 GPa, about 1.8 GPa, about 1.9 GPa, about 2.0 GPa, a range encompassed by any of the foregoing values, any combination of the foregoing values, or any set of intermediate values encompassed by a range comprising the foregoing values.

In a further aspect, the suitable period of time in the fourth step is about 1 min, about 5 min, about 10 min, about 15 min, about 20 min, about 25 min, about 30 min, a range encompassed by any of the foregoing values, any combination of the foregoing values, or any set of intermediate values encompassed by a range comprising the foregoing values.

In a further aspect, the suitable temperature in the fourth step is a temperature from about 290 K to about 380 K. In a still further aspect, the suitable temperature in the fourth step is a temperature from about 291 K to about 379 K. In a yet further aspect the suitable temperature in the fourth step is a temperature from about 292 K to about 378 K. In a still further aspect, the suitable temperature in the fourth step is a temperature from about 293 K to about 377 K. In a yet further aspect, the suitable temperature in the fourth step is a temperature from about 294 K to about 376 K. In a still further aspect, the suitable temperature in the fourth step is a temperature from about 295 K to about 375 K. In a yet further aspect, the suitable temperature in the fourth step is a temperature from about 296 K to about 374 K. In a still further aspect, the suitable temperature in the fourth step is a temperature from about 297 K to about 373 K. In a yet further aspect, the suitable temperature in the fourth step is a temperature from about 298 K to about 373 K. In an even further aspect, the suitable temperature in the fourth step is a temperature of about 290 K, about 295 K, about 300 K, about 305 K, about 310 K, about 315 K, about 320 K, about 325 K, about 330 K, about 335 K, about 340 K, about 345 K, about 350 K, about 355 K, about 360 K, about 365 K, about 370 K, about 375 K, a range encompassed by any of the foregoing values, any combination of the foregoing values, or any set of intermediate values encompassed by a range comprising the foregoing values.

In a further aspect, the disclosed methods of making a high performance, thermoelectric ceramic oxide comprises as a fifth step sintering of the pellets from the fourth step in a suitable heating apparatus in the presence of oxygen at a suitable temperature for a suitable period of time. In a still further aspect, the suitable heating apparatus can be a furnace, such as a tube furnace. In a yet further aspect, in the presence of oxygen can be a gas mixture enriched in oxygen or a standard, ambient air mixture. In some aspects, the suitable period of time for the fifth step is about 10 min to about 120 h, any value or set of intermediate values encompassed by the foregoing values, or any sub-range within the foregoing values. In alternative aspects, the suitable period of time for sintering can be several days to several weeks. In a yet further aspect, the suitable temperature for sintering can be about 1320 K to about 1630 K, any value or set of intermediate values encompassed by the foregoing values, or any sub-range within the foregoing values.

REFERENCES

Various citations are made herein throughout using the format of "(X)", "(X-Y)", and "(X, Y, and Z)", wherein X, Y, and Z correspond to the reference numbers, 1-17, given herein below. These citations are incorporated by reference in their entirety.

(1) Fergus J W. Oxide materials for high temperature thermoelectric energy conversion. Journal of the European Ceramic Society. 2012; 32(3):525-40.
(2) Bosanac L, et al. Efficient optical trapping and visualization of silver nanoparticles. Nano Lett. 2008; 8(5): 1486-91.
(3) Mehdizadeh Dehkordi A, et al. Large Thermoelectric Power Factor in Pr-Doped $SrTiO_3$-$\delta$ Ceramics via Grain-Boundary-Induced Mobility Enhancement. Chemistry of Materials. 2014; 26(7):2478-85.
(4) Bocher L, et al. High temperature stability, structure and thermoelectric properties of $CaMn_{1-x}Nb_xO_3$ phases. Acta Materialia. 2009; 57(19):5667-80.
(5) Bocher L, et al. $CaMn_{1-x}Nb_xO_3$ ($x \leq 0.08$) Perovskite-Type Phases as Promising New High-Temperature n-Type Thermoelectric Materials. Inorganic chemistry. 2008; 47(18):8077-85.
(6) Wang Y, et al. High temperature thermoelectric response of electron-doped $CaMnO_3$. Chemistry of Materials. 2009; 21(19):4653-60.
(7) Zhu Y-H, et al. Effects of Dy and Yb co-doping on thermoelectric properties of $CaMnO_3$ ceramics. Ceramics International. 2015; 41(1):1535-9.
(8) Huang X, et al. High temperature thermoelectric properties of $Ca_{1-x}Bi_xMn_{1-y}V_yO_3$-$\delta$ ($0 \leq x = y \leq 0.08$). Solid State Communications. 2008; 145(3):132-6.
(9) Reimann T. and Töpfer J. Thermoelectric properties of Gd/W double substituted calcium manganite. Journal of Alloys and Compounds. 2017; 699:788-95.
(10) Zhu Y, et al. High-temperature thermoelectric performance of $Ca_{0.96}Dy_{0.02}$ $RE_{0.02}MnO_3$ ceramics (RE=Ho, Er, Tm). Ceramics International. 2014; 40(10): 15531-6.
(11) Wang Y, et al. High temperature thermoelectric characteristics of $Ca_{0.9}R_{0.1}MnO_3$ (R=La, Pr . . . Yb). Journal of Applied Physics. 2008; 104(9):093703.
(12) Elsheikh M H, et al. A review on thermoelectric renewable energy: Principle parameters that affect their performance. Renewable and Sustainable Energy Reviews. 2014; 30:337-55
(13) Kabir R, et al. Role of Bi doping in thermoelectric properties of $CaMnO_3$. Journal of Alloys and Compounds. 2015; 628:347-51
(14) Hartung D, et al. Assessing the thermoelectric properties of CuxO (x=1 to 2) thin films as a function of composition. Applied Physics Letters. 2015; 106(25): 253901.
(15) Mikami M, et al. The effect of Ag addition on electrical properties of the thermoelectric compound $Ca_3Co_4O_9$. Journal of Solid State Chemistry. 2005; 178(7):2186-90.
(16) Zeng C, et al. Enhanced Thermoelectric Performance of $SmBaCuFeO_{5+\delta}$/Ag Composite Ceramics. Journal of the American Ceramic Society. 2016; 99(4):1266-1270.
(17) Ito M. and Sumiyoshi J. Enhancement of thermoelectric performance of $NaxCo_2O_4$ with Ag dispersion by precipitation from Ag+ aqueous solution. Journal of sol-gel science and technology. 2010; 55(3):354-9.

The various aspects described within are merely descriptions and are in no way intended to limit the scope of the invention. Modifications of the present invention will become obvious to one skilled in the art in light of the above descriptions and such modifications are intended to fall within the scope of the appended claims. It is understood that no limitations with respect to the specific methods and compounds illustrated herein are intended or should be inferred.

Before proceeding to the Examples, it is to be understood that this disclosure is not limited to particular aspects described, and as such may, of course, vary. Other systems, methods, features, and advantages of foam compositions and components thereof will be or become apparent to one with skill in the art upon examination of the following drawings and detailed description. It is intended that all such additional systems, methods, features, and advantages be included within this description, be within the scope of the present disclosure, and be protected by the accompanying claims. It is also to be understood that the terminology used herein is for the purpose of describing particular aspects only, and is not intended to be limiting. The skilled artisan will recognize many variants and adaptations of the aspects described herein. These variants and adaptations are intended to be included in the teachings of this disclosure and to be encompassed by the claims herein.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary of the disclosure and are not intended to limit the scope of what the inventors regard as their disclosure. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Example 1. Preparation of $Ca_{1-x}Bi_xMnCu_yO_3$ Materials

Precursor powders having a nominal formulation composition of $Ca_{1-x}Bi_xMnCu_yO_3$ (x=0.02, 0.03, 0.04; y=0.02, 0.04) were prepared by a sol-gel chemical solution route. Citric acid (BDH Chemical), ethylene glycol (BDH Chemical), polyethylene glycol, nitric acid (68%-70% concentration), and nominal amounts of $Ca(NOs)_2 \cdot 4H_2O$ (99%, Acros Organics), $Bi(NO_3)_3 \cdot 5H_2O$ (99%, Acros Organics), $Mn(NO_3)_2 \cdot 6H_2O$ (99%, Acros Organics), and $Cu(NO)_2$ (99.5%, Strem Chemical) were used as starting raw materials. The chemistry of the designed alloy was controlled upon changing the x and y values in the nominal composition of $Ca_{1-x}Bi_xMnCu_yO_3$ (x=0.02, 0.03, 0.04; y=0.02, 0.04). For a non-limiting example, to obtain a 10 g of dry precursor powders with nominal chemistry of $Ca_{0.97}Bi_{0.03}MnCu_{0.04}O_3$, the theoretical value and the actual amount used for each component of the raw materials are listed in Table 1 below.

TABLE 1

| Component | Theoretical | Actual |
|---|---|---|
| Calcium, $Ca(NO_3)_2 \cdot 4H_2O$ | 15.347 g | 15.353 g |
| Manganese, $Mn(NO_3)_2 \cdot 6H_2O$ | 16.813 g | 16.852 g |
| Bismuth, $BiNO_3)_3 \cdot 5H_2O$ | 0.975 g | 0.978 g |
| Copper, $Cu(NO_3)_2$ | 0.647 g | 0.650 g |
| Water (deionized) | 140.8 ml | 141 ml |
| Citric acid | 70.397 g | 70.4 g |
| Ethylene glycol | 20.770 g | 20.768 g |
| Polyethylene glycol | 14.079 g | 14.079 g |
| Nitric acid | 14.079 ml | 14.1 ml |

The above listed raw materials with different mass ratio to achieve the chemistry of $Ca_{1-x}Bi_xMnCu_yO_3$ (x=0.02, 0.03, 0.04; y=0.02, 0.04) were then dissolved in deionized water with stir at 353 K for 3 h to form the gel. The gel is ashed at 773 K in a box furnace. The ashed product is ground using mechanical ball-milling, and then calcined at 1173 K in a tube furnace with oxygen flow for 2 h to form the precursor powders (ash-based powder). The powders are then uniaxially pressed into pellets under 0.75 GPa at 150° C. (or 423 K) for 2 minutes. The pellets are sintered at 1373 K in a tube furnace with oxygen flow for 2 h to obtain the bulk samples. It is noted that all of the specified temperatures and times noted above are approximate and may vary somewhat without significant alteration in thermoelectric performance of the final product.

The absolute Seebeck coefficient S and electrical resistivity ρ were measured in the direction parallel to the pressed plane from 320 K up to 1080 K using a Linseis LSR-1100 in a He environment. X-ray diffraction (XRD) analysis was carried out using a PANalytical X'Pert Pro X-ray Diffractometer for phase identification. A JEOL JSM 7600F Scanning electron microscope (SEM), and a JEM-2100 transmission electron microscope (TEM) equipped with energy dispersive X-ray spectroscopy (EDS) were used to examine the structure and chemistry from micron to atomic scale. The particular brands and models of equipment and instruments described herein are a laboratory choice and are not intended to limit the scope of the aspects of the invention or any claims thereof.

Example 2. Enhanced Physico-Mechanical Properties of $Ca_{1-x}Bi_xMnCu_yO_3$ Materials Disclosed $Ca_{1-x}Bi_xMnCu_yO_3$ materials prepared as described in Example 1 show significant enhancement of the mechanical integrity and toughness of the bulk oxide ceramics. Table 2 shows the apparent densities of the oxide ceramic pellets. Compared with the baseline pure $CaMnO_3$, the density of the Bi-doped pellets with chemistry of $Ca_{1-x}Bi_xMnO_3$ increases with increases of Bi doping level. The density of the pellets further increases as the Cu is further introduced in the samples with the chemistry of $Ca_{1-x}Bi_xMnCu_yO_3$.

TABLE 2

Apparent densities of the samples $Ca_{1-x}Bi_xMnCu_yO_3$
(x = 0, 0.02, 0.03, 0.04; y = 0, 0.02, 0.04)

| Chemical Formula | Density (g/cm$^3$) |
|---|---|
| $CaMnO_3$ | 3.6386 |
| Ca0.98Bi0.02MnO3 | 4.2541 |
| Ca0.97Bi0.03MnO3 | 4.3657 |
| Ca0.96Bi0.04MnO3 | 4.6715 |

TABLE 2-continued

Apparent densities of the samples $Ca_{1-x}Bi_xMnCu_yO_3$
(x = 0, 0.02, 0.03, 0.04; y = 0, 0.02, 0.04)

| Chemical Formula | Density (g/cm$^3$) |
|---|---|
| Ca0.98Bi0.02MnO3Cu0.02 | 4.5082 |
| Ca0.97Bi0.03MnO3Cu0.04 | 4.5250 |

For the thermoelectric device application, the bulk oxide ceramics should have high density to ensure the mechanical strength during operation and device fabrication machining. The samples with Cu non-stoichiometric addition have increased density, and most importantly, the increased overall mechanical toughness. The ceramic $CaMnO_3$ pellets usually suffer from cracking during the high temperature sintering. The ceramic pellets can be easily broken into pieces without any machining or further thermal cycle treatment at high temperatures. When the Cu is introduced to the Bi-doped $CaMnO_3$ pellets, the pellets exhibit superior toughness and remain intact after machining and many cycles of thermal treatment from room temperature to 800° C. in various gas atmospheres. The high density of the pellets and the superior mechanical toughness make the ceramics described in this invention suitable for practical device applications.

Figure 1B:
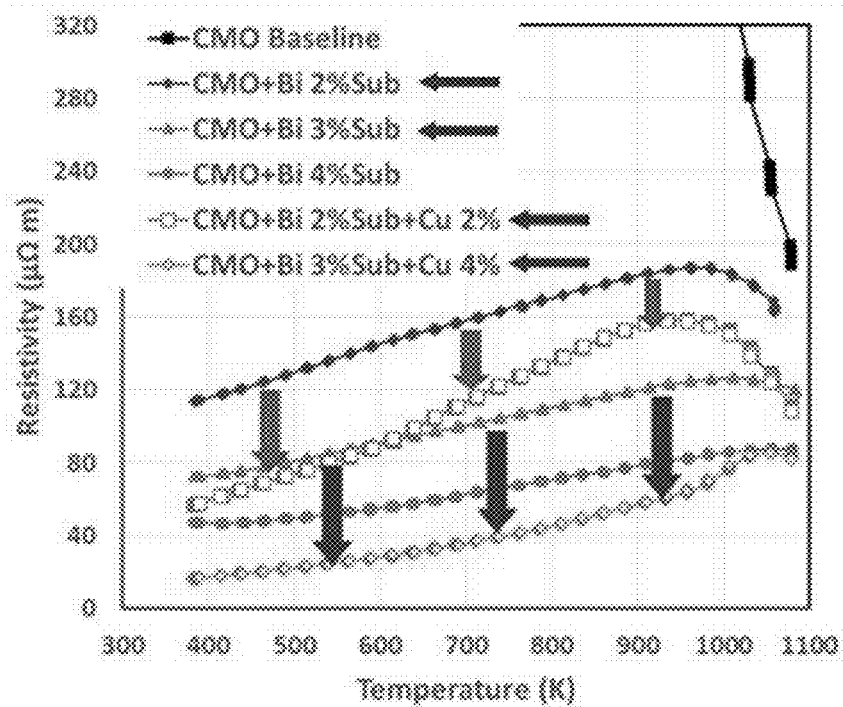
FIG. 1B shows an enlarged portion of the low resistivity regime in FIG. 1A.

Example 3. Enhanced Electrical Power Factor and Energy Conversion Efficiency of $Ca_{1-x}Bi_xMn\text{-}Cu_yO_3$ Materials Disclosed $Ca_{1-x}Bi_xMnCu_yO_3$ materials prepared as described in Example 1 show an increase of the electrical power factor and energy conversion efficiency. For example, FIGS. 1A and 1B show the temperature dependence of the electrical resistivity. In comparison with the pristine $CaMnO_3$, the Bi substitution of Ca results in the decrease of the electrical resistivity. The electrical resistivity from the pristine $CaMnO_3$ shows semiconductor behavior and decrease as the temperature increase (FIG. 1A). On the other hand, the samples with Bi substitution are with metallic behavior and their resistivity increases as the measurement temperature increases to 1083 K (FIG. 1B). The electrical resistivity of the samples $Ca_{1-x}Bi_xMnO_3$ decreases as the Bi concentration increases from x=0.02 to x=0.04. When Cu is further added to sample of $Ca_{0.98}Bi_{0.02}MnO_3$, the sample $Ca_{0.98}Bi_{0.02}MnCu_{0.02}O_3$ exhibits the same metallic behavior with resistivity increasing as the measurement temperature increases. But, the absolute value of the electrical resistivity is further decreased from the entire measurement temperature regime as shown in FIG. 1B. Likewise, the resistivity of $Ca_{0.97}Bi_{0.03}MnCu_{0.04}O_3$ is much lowered than by about a factor of 3 than that of the sample $Ca_{0.097}Bi_{0.03}MnO_3$. Remarkably, the electrical resistivity of $Ca_{0.97}Bi_{0.03}MnCu_{0.04}O_3$ reached value of ~17 μΩm at 377 K, which is the lowest electrical resistivity ever reported for $CaMnO_3$.

Figure 2A:
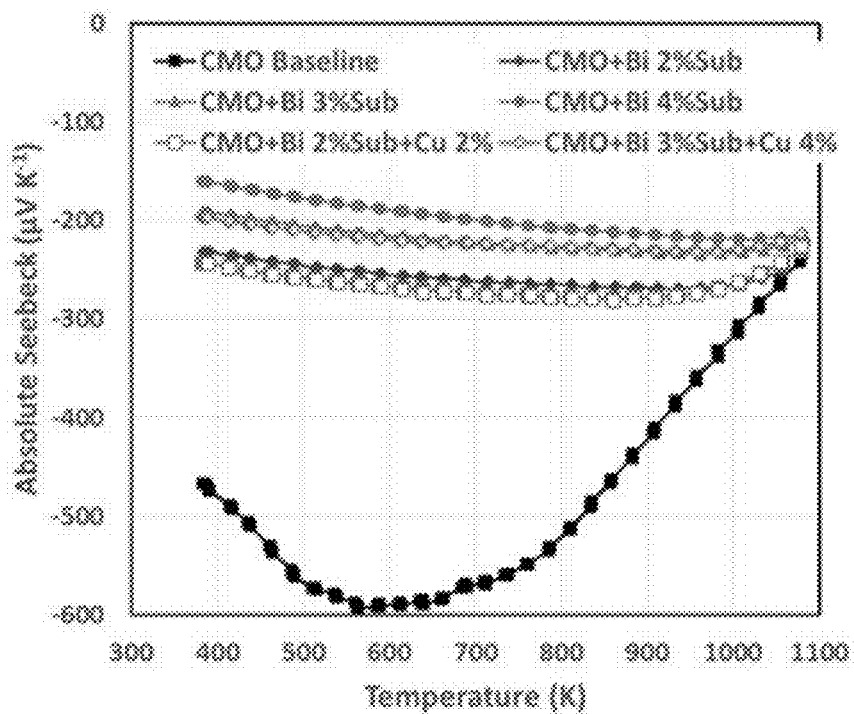
FIG. 2A shows a representative graph of temperature dependence of Seeback coefficient for a representative disclosed thermoelectric ceramic oxide composition comprising $Ca_{1-x}Bi_xMnCu_yO_3$.
Figure 2B:
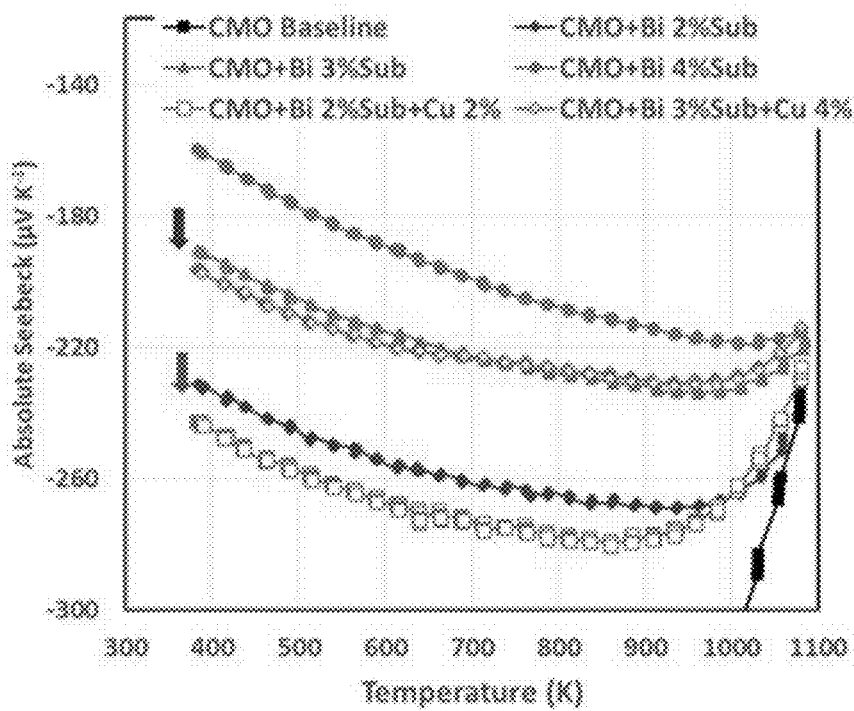
FIG. 2B shows an enlarged portion of the low resistivity regime in FIG. 2A.
Figure 3:
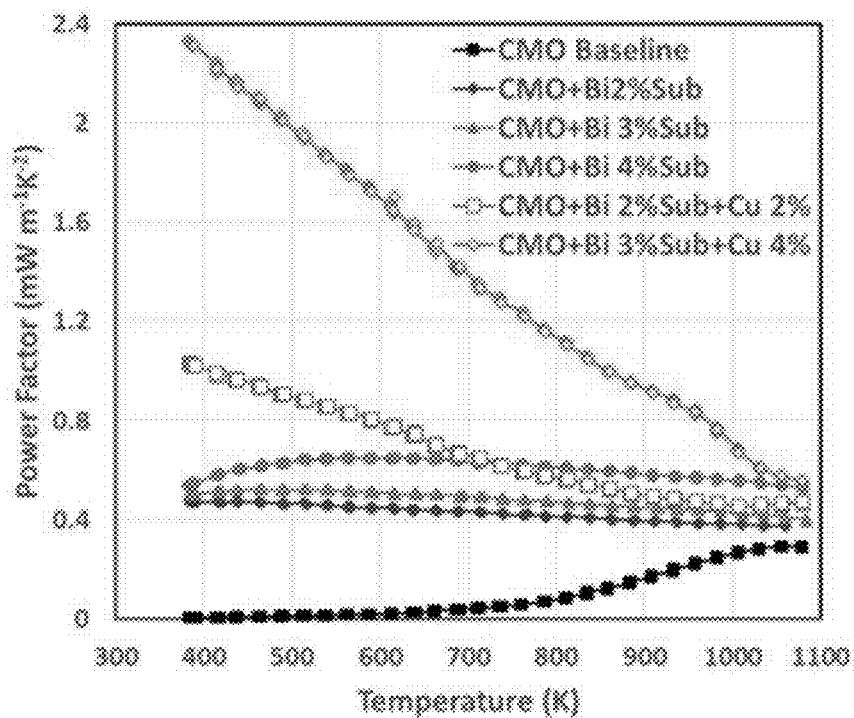
FIG. 3 shows a representative graph of temperature dependence of electrical power factor for a representative disclosed thermoelectric ceramic oxide composition comprising $Ca_{1-x}Bi_xMnCu_yO_3$.

FIGS. 2A and 2B show the temperature dependence of the Seebeck coefficient S. All samples are n-type semiconductor with negative Seebeck coefficient values. The absolute Seebeck coefficient of the samples $Ca_{1-x}Bi_xMnO_3$ decreases continuously as the Bi concentration increases to x=0.04, indicating the increased carrier concentration induced by Bi substitution of Ca. By contrast, when Cu non-stoichiometric addition is applied to the Bi doped samples, the $Ca_{1-x}Bi_xMnCu_yO_3$ samples exhibit a slightly increased absolute Seebeck coefficient in comparing with the corresponding parent sample without Cu addition, as depicted in FIG. 2B. Benefiting from the low electrical resistivity and increased Seebeck coefficient, the sample of $Ca_{0.97}Bi_{0.03}MnCu_{0.04}O_3$ exhibits a high power factor of 2.4 $mWm^{-1}K^{-2}$, which is about factor of 5 increase compared to that from the sample $Ca_{0.97}Bi_{0.03}MnO_3$, as shown in FIG. 3. The power factor of 2.4 $mWm^{-1}K^{-2}$ from $Ca_{0.97}Bi_{0.03}MnCu_{0.04}O_3$ sample is also the highest power factor so far reported in the literatures for thermoelectric $CaMnO_3$ synthesized using different methods (4-11). This value of 2.4 $mWm^{-1}K^{-2}$ is also comparable with that from the state-of-the art SiGe and Bi—Te thermoelectric semiconductors (2-3).

Figure 4:
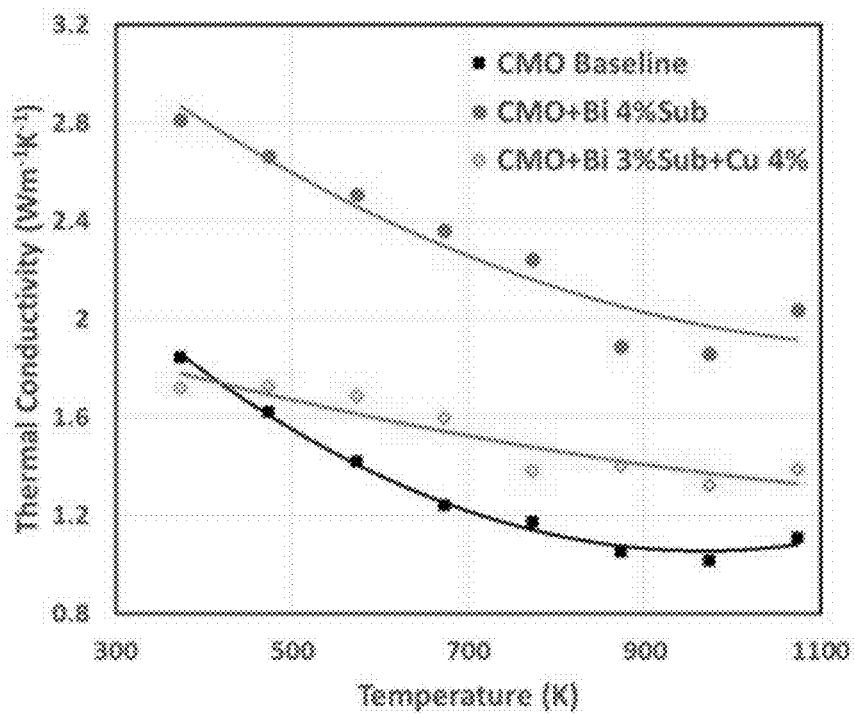
FIG. 4 shows a representative graph of temperature dependence of thermal conductivity for a representative disclosed thermoelectric ceramic oxide composition comprising $Ca_{1-x}Bi_xMnCu_yO_3$.
Figure 5:
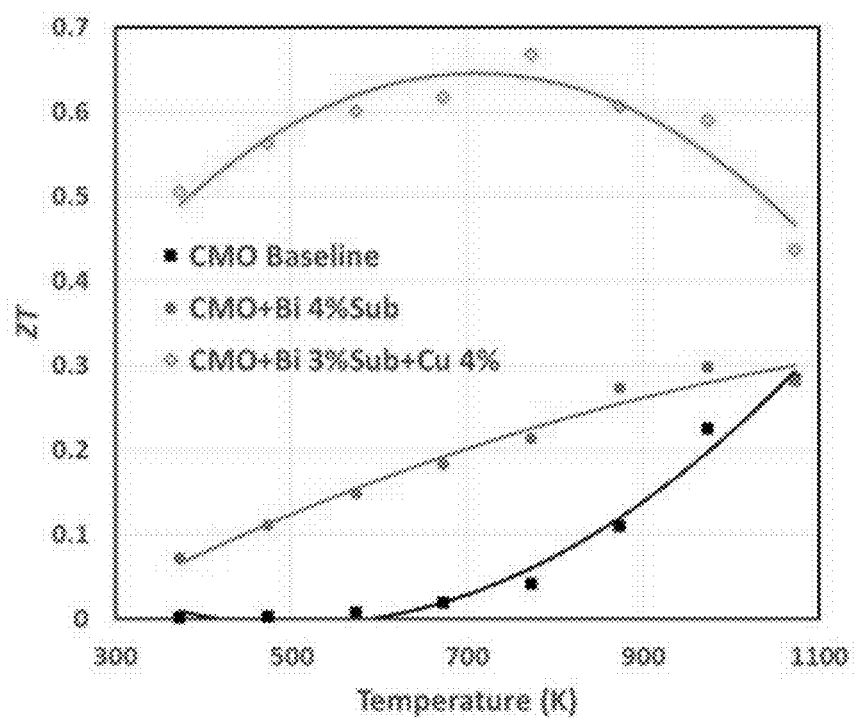
FIG. 5 shows a representative graph of temperature dependence of ZT for a representative disclosed thermoelectric ceramic oxide composition comprising $Ca_{1-x}Bi_xMnCu_yO_3$.

The thermal conductivity of the samples with different chemistry is shown in FIG. 4. The thermal conductivity of sample $Ca_{0.97}Bi_{0.03}MnCu_{0.04}O_3$ is higher than that of the baseline, but, it is slightly lower than that of the Bi-doped $CaMnO_3$ samples. Overall, the sample of $Ca_{0.97}Bi_{0.03}MnCu_{0.04}O_3$ has the maximum ZT value of 0.67 at 773 K (FIG. 5) which is a factor of more than 2 of that reported in the literature of ZT~0.3 (4-5). The thermoelectric oxide from the sample $Ca_{0.97}Bi_{0.03}MnCu_{0.04}O_3$ exhibits a high plateau of the ZT from room temperature to 1073K. Furthermore, from room temperature to 773 K, the ZT of the n-type bulk oxide is higher than that from the state-of-the art thermoelectric SiGe bulk alloys (12).

Figure 7A:
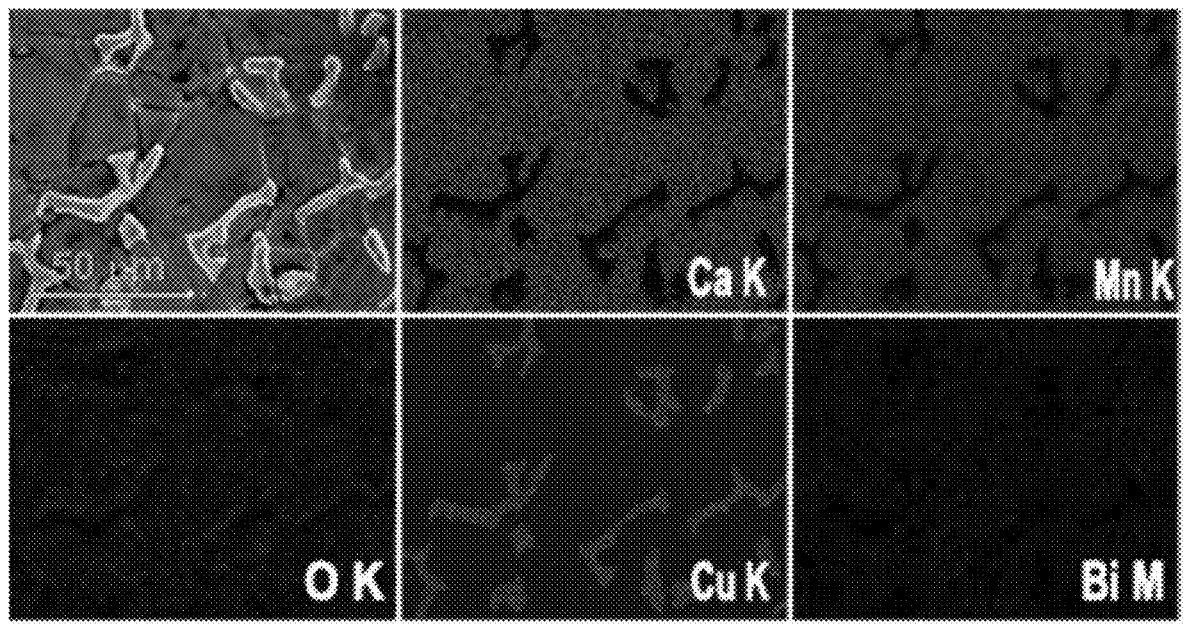
FIG. 7A shows representative scanning electron micrographs showing the distribution of the sparsely distributed CuO phase at the grain boundary of sample $Ca_{1-x}Bi_xCu_{0.04}MnO_3$.
Figure 7B:
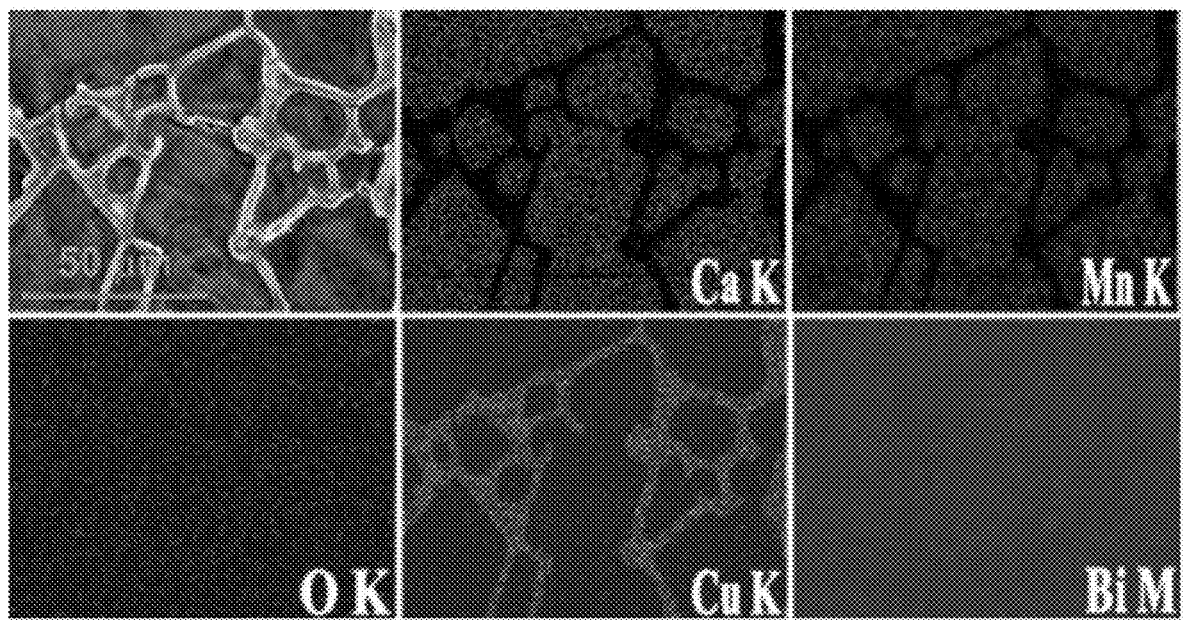
FIG. 7B shows representative scanning electron micrographs showing the distribution of the sparsely distributed CuO phase formed percolating network along the grain boundaries of $Ca_{1-x}Bi_xCu_{0.04}MnO_3$.

Example 4. Microstructural Characterization of $Ca_{1-x}Bi_xMnCu_yO_3$ Materials Disclosed $Ca_{1-x}Bi_xMnCu_yO_3$ materials prepared as described in Example 1 show microstructure changes induced by chemistry modification and the existence of CuO liquid phase at the grain boundaries of Bi-doped $CaMnO_3$. The plan-view SEM images in FIGS. 6A-6E were taken from the pressed plane of the pellets. Bi substitution of Ca did not introduce the apparent grain size and grain morphology changes in comparison with that from the baseline. By contrast, when the Cu is introduced into the Bi-doped $CaMnO_3$ as nonstoichiometric addition, there is significant grain growth from ~2 μm to ~20 μm. The SEM images also clearly demonstrate the formation of the secondary phase at the grain boundaries. The secondary phase in the sample with Cu of 0.02 and 0.04 is sparsely distributed. With the increase of Cu addition level to 0.15, the secondary phase become connected and formed the percolating network along the grain boundaries. The SEM elementally mapping in FIG. 7 clearly indicate the secondary phase at the grain boundaries are CuO.

Example 5. Nanostructural Characterization of $Ca_{1-x}Bi_xMnCu_yO_3$ Materials

Figure 8:
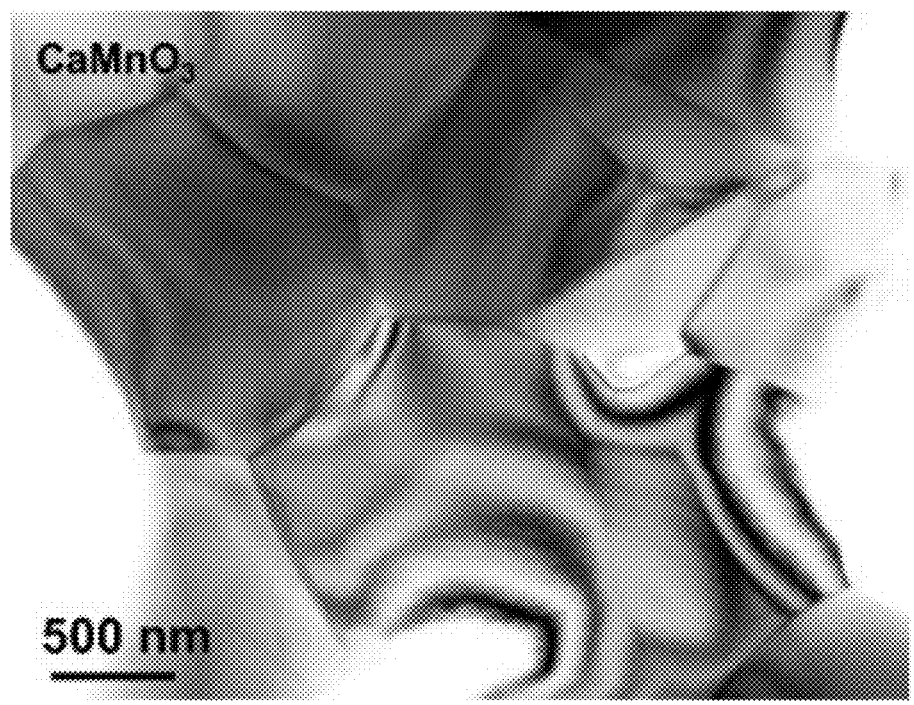
FIG. 8 shows a representative transmission electron micrograph of a baseline pure $CaMnO_3$ sample.
Figure 9:
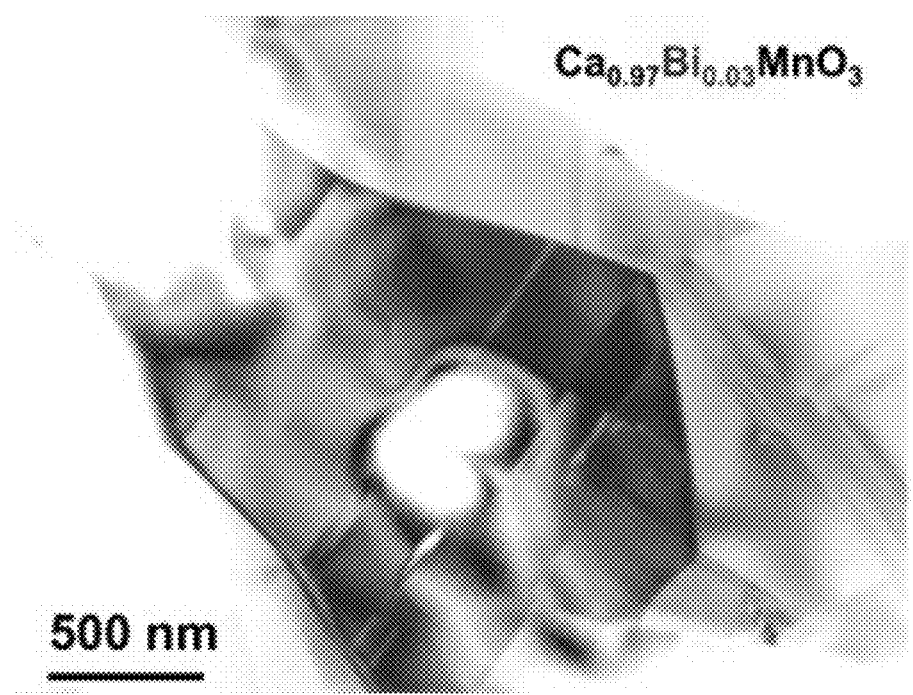
FIG. 9 shows a representative transmission electron micrograph of a disclosed Bi-doped $CaMnO_3$ composition.
Figure 10:
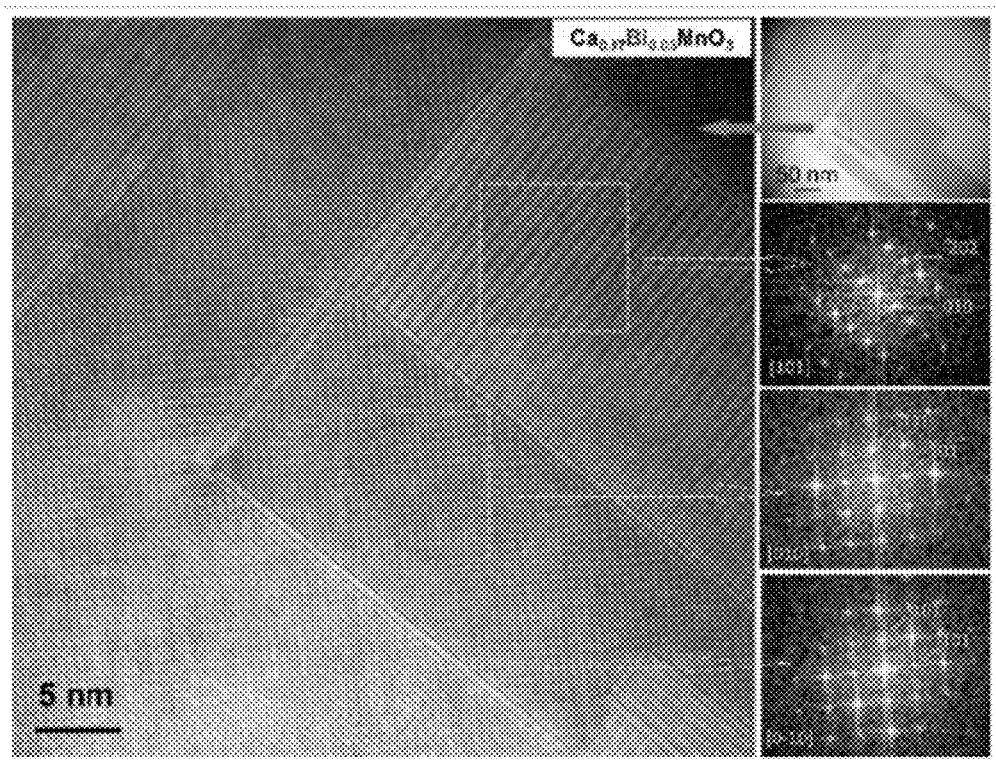
FIG. 10 shows a representative high resolution transmission electron micrograph of a disclosed Bi-doped $CaMnO_3$ composition.
Figure 11A:
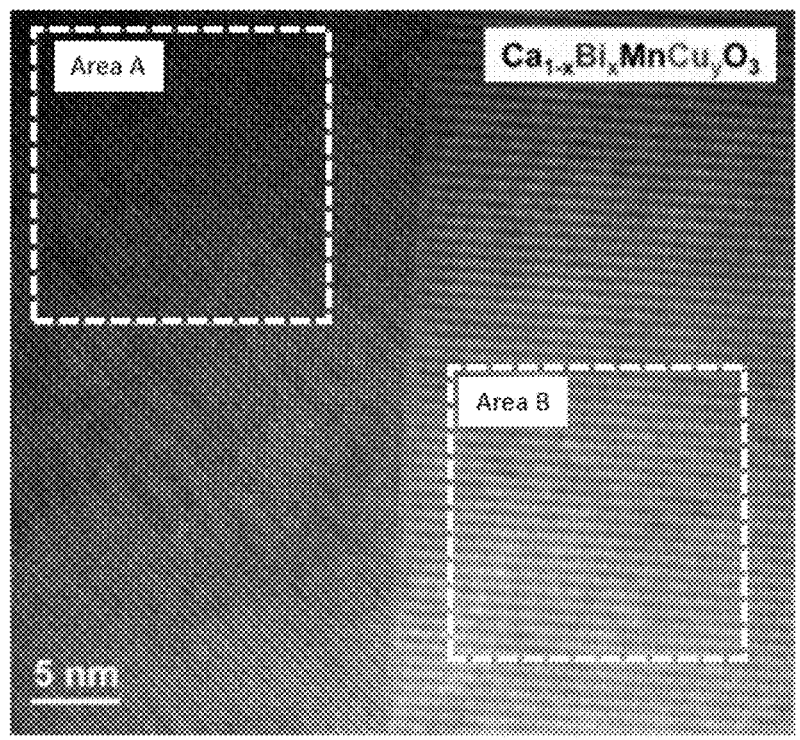
FIGS. 11A-11C show representative high resolution transmission electron micrographs of a disclosed Cu-added Bi-doped $CaMnO_3$ composition.
Figures 11B, 11C:
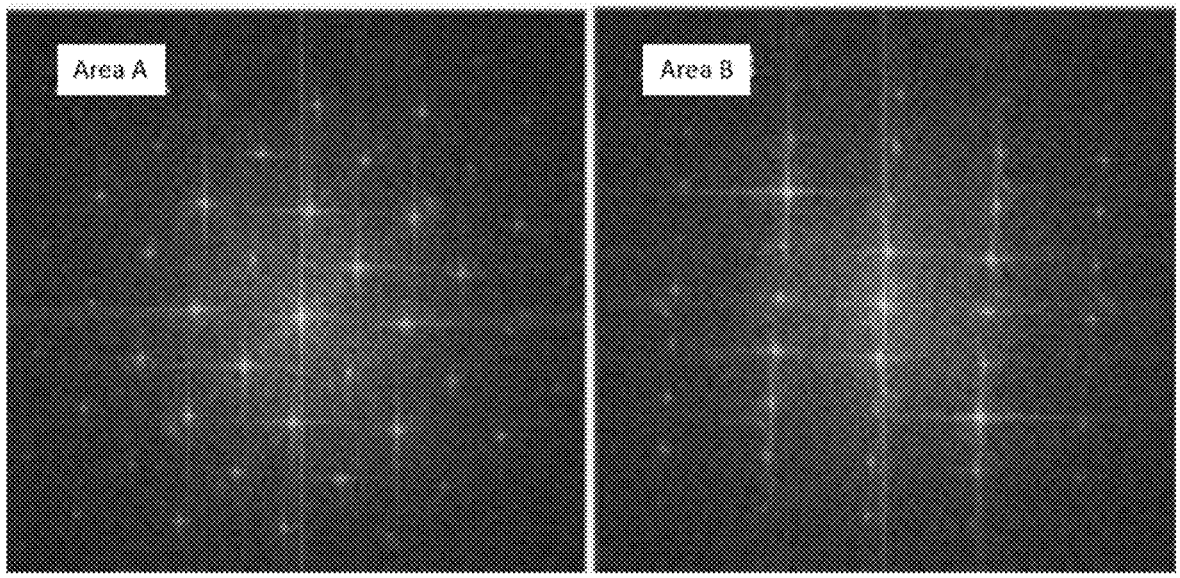

Disclosed $Ca_{1-x}Bi_xMnCu_yO_3$ materials prepared as described in Example 1 show nanostructure changes of oxide ceramics introduced by sample chemistry modification. The samples of $CaMnO_3$ $CaMnO_3$, $Ca_{0.97}Bi_{0.03}MnO_3$ and $Ca_{0.97}Bi_{0.03}MnCu_{0.04}O_3$ with superior thermoelectric performance were subjected to TEM examination. FIG. 8 depicts the representative morphology of granular pristine $CaMnO_3$ without much crystal defects. The Bi substitution of Ca resulted in the formation of domain boundaries within the $CaMnO_3$ grains (FIG. 9). High resolution TEM (FIG. 10) indicates those domain boundaries are separating the nano domains with different crystal orientations. In the sample $Ca_{0.97}Bi_{0.03}MnCu_{0.04}O_3$ with Cu addition, the nano-domains (FIG. 11) persist.

Figure 12:
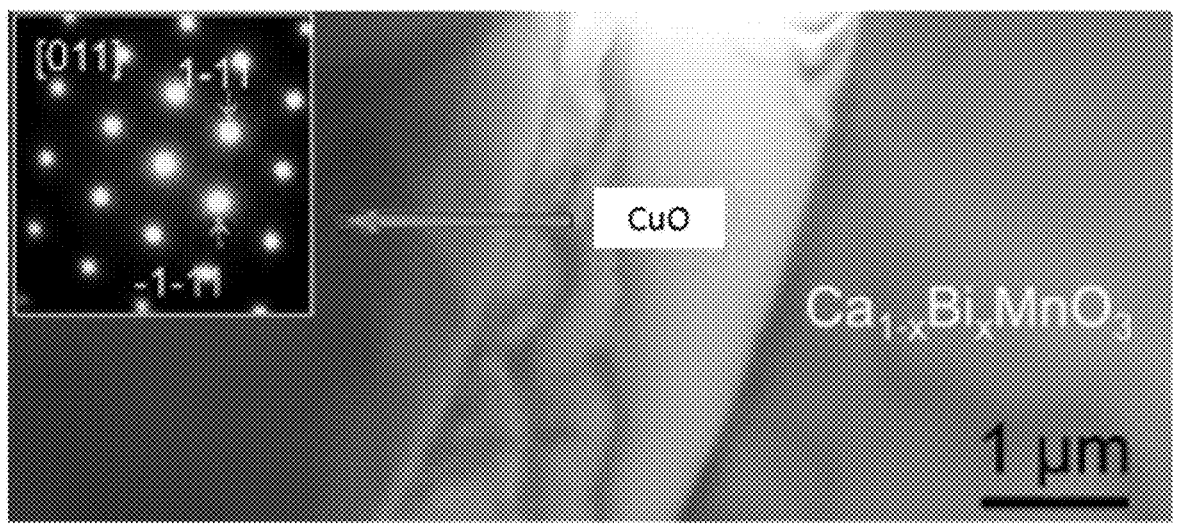
FIG. 12 shows a representative transmission electron micrograph of the grain boundaries of a disclosed $Ca_{1-x}Bi_xMnCu_yO_3$ composition.

The TEM diffraction contrast image of FIG. 12 is taken from the grain boundary region from the samples with Cu addition. Consistent with the SEM analysis, the grain boundary phase is about 2 microns in width; the electron diffraction from the secondary phase was indexed as CuO with monoclinic crystal structure. Except for CuO, no other impurity phases were identified from all samples in the present study. The TEM image in FIG. 12 also clearly illustrates that the CuO phase has a strong and solid bonded interface with $Ca_{1-x}Bi_xMnO_3$ grain matrix. There is no nano-cracking or nano-voids existing at the interface regions.

Example 6. Effect of Bi Substitution of Ca on Electrical Properties and Nanostructure of $Ca_{1-x}Bi_xMnCu_yO_3$ Materials Disclosed $Ca_{1-x}Bi_xMnCu_yO_3$ materials prepared as described in Example 1 show an effect of Bi substitution of Ca in the lattice of $CaMnO_3$ on their electrical properties and nanostructure. Bi substitution does result in the increased pellet density, and the pellet density increases with the increase of Bi doping level, as shown in Table 2. But Bi doping did not result in the grain growth. The samples exhibited the same morphology and grain size upon Bi substitution of Ca, as demonstrated by the SEM images in FIG. 6. On the other hand, Bi substitution clearly affects both the electrical resistivity and Seebeck coefficient. Consistent with literature reports (13), the current result of simultaneous decreases in resistivity and Seebeck coefficient indicates an increased carrier concentration, resulting from Bi-substitution of Ca. The increased carrier concentration is due to the substitution of divalent $Ca^{2+}$ with trivalent $BP$ into the structure of $Ca_{1-x}Bi_xMnO_3$ that will generate one electron per cation dopant. On other hand, since Bi and Ca are of similar ionic radii, the observed increased of lattice parameter (XRD results are not shown here) due to Bi substitution is attributed in part with the formation of $Mn^{3+}$ (0.645 A), whose ionic radius is larger than $Mn^{4+}$ (0.53 A). The carrier concentration increase caused by Bi substitution was also compensated by the decreased carrier concentration caused by the valence state change from $Mn^{4+}$ to $Mn^{3+}$. Eventually, the overall carrier concentration is increased due to Bi substitution evidenced by the simultaneously increased Seebeck coefficient and decreased electrical resistivity.

Figures 13A, 13B, 13C:
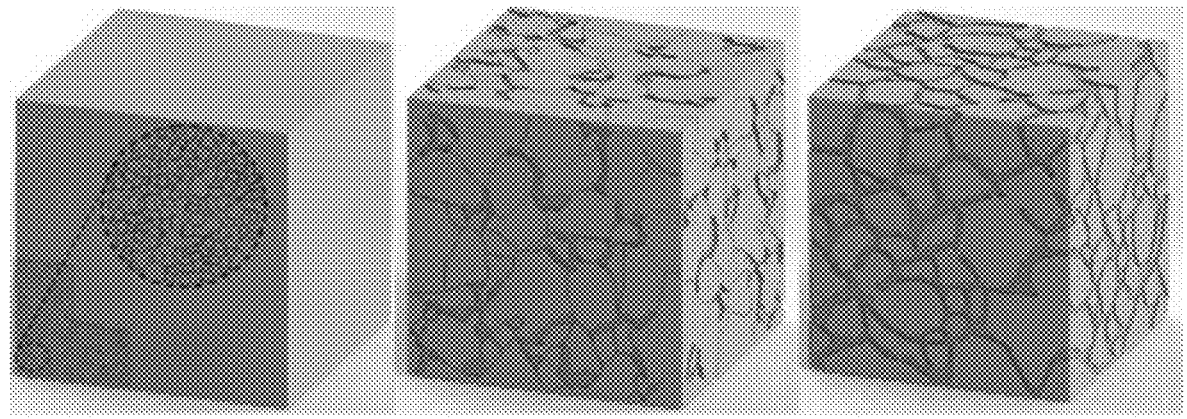
FIGS. 13A-13C show a model for the evolution of grain morphology and formation of a grain boundary network upon Cu addition in disclosed $Ca_{1-x}Bi_xMnCu_yO_3$ compostions.

Example 7. Effect of Nonstoichiometric Cu Addition on Microstructure and Properties of $Ca_{1-x}Bi_xMnCu_yO_3$ Materials Disclosed $Ca_{1-x}Bi_xMnCu_yO_3$ materials prepared as described in Example 1 show an effect of the Cu nonstoichiometric addition on the microstructure and properties of the bulk ceramics. Cu addition apparently affects the morphology of the $CaMnO_3$ grain matrix. As shown in the SEM (FIGS. 6A and 6B), the grain size of the $CaMnO_3$ and Bi doped $CaMnO_3$ is all about 1 μm. In the samples with Cu addition, the grain size increase significantly to about 20 μm. Meanwhile, Cu addition also triggers the formation of CuO at the grain boundaries. With the increase of the Cu addition level, the CuO progresses from the sparsely distributed grain boundary phase to the connected percolating network along the grain boundaries. The evolution of the grain morphology and formation of the grain boundary network upon Cu addition is depicted in the 3-D schematic in FIG. 13.

Figure 14:
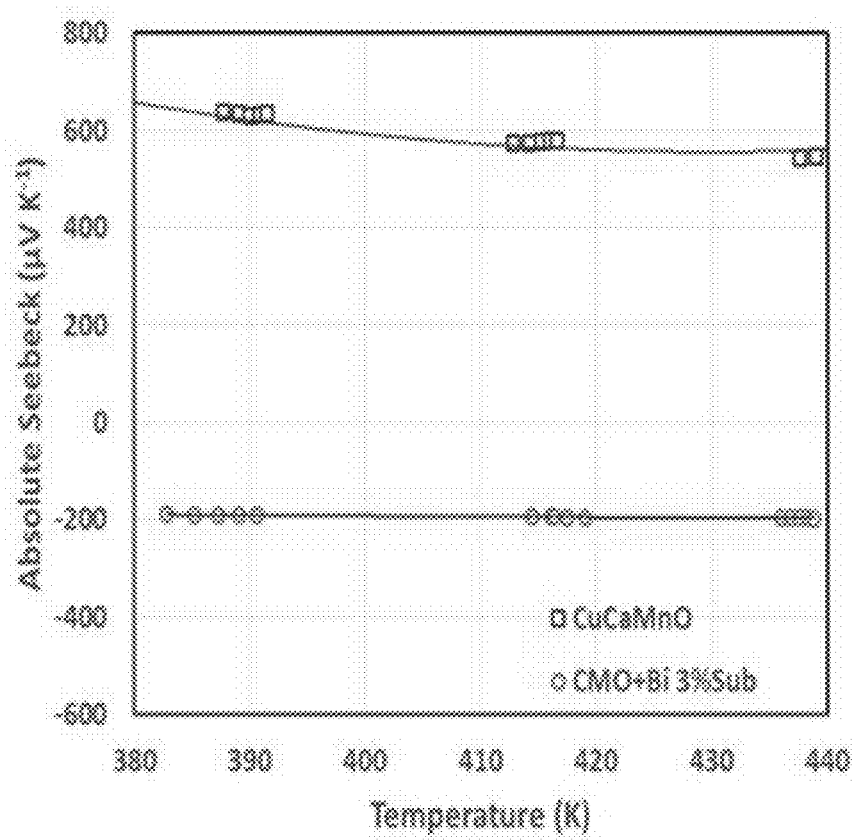
FIG. 14 shows a representative graph showing that Cu oxide is a p-type conductor with a positive Seeback coefficient, whereas a disclosed $Ca_{1-x}Bi_xMnO_3$ composition is an n-type conductor with a negative Seeback coefficient.

To understand the formation of the grain boundary phase, the CuO precursors were made using the same chemical sol-gel route as described previously. At the same sintering temperature of 1373K and under the same sintering atmosphere that $Ca_{1-x}Bi_xMnCu_yO_3$ samples are sintered, the CuO green pellets become liquid during the sintering and no final pellet are formed. A separate CuO green pellet was then sintered at a much lower temperature of 1233K, and its electrical resistivity and Seebeck coefficient was then measured. The electrical resistivity of CuO was determined to be over 10,000 times higher than that of the Bi-doped $CaMnO_3$. Different from $CaMnO_3$ samples with negative Seebeck coefficient, the CuO has a positive Seebeck coefficient (FIG. 14). CuO is thus confirmed to be a metal deficient p-type semiconductor (14) with copper vacancies at low temperature, and low electrical conductivities.

Even the CuO has very high electrical resistivity, the electrical resistivity values of the Cu-added $Ca_{1-x}Bi_xMnO_3$ samples were all lower than that of the samples without Cu. The decreased electrical resistivity were due to the increased carrier mobility adjacent to the grain boundaries, and due to the formation of CuO at the $CaMnO_3$ grain boundaries. The grain size from the samples of Cu addition increased by a factor of 20, thus the grain boundaries density decreased, which significantly reduced the scattering of electrons by the grain boundaries.

On the other hand, the p-type CuO at the grain boundaries form the electrical connections between the neighboring n-type $CaMnO_3$ grains. Therefore, the carrier scattering at the grain boundaries can be further reduced and lead to the increased carrier mobility and decreased electrical resistivity. The observed phenomenon of increased electrical conductivity of n-type $CaMnO_3$ caused by the existence of sparsely distributed p-type CuO at the grain boundaries is similar to what has been reported for the p-type materials. There is increased electrical conductivity of various p-type ceramics of $Ca_3Co_4O_9$ (15), $SmBaCuFeO_x$ (16), and $Na_xCo_2O_4$ (17) caused by the addition of n-type Ag particles. In the present work, with the increase of Cu addition, once the CuO formed connected network and percolating in the $CaMnO_3$ matrix, the resistivity of the entire sample increased due to the blockage from the highly resistance CuO for the carrier flow.

CuO liquid phase formation also has influence of the thermal conductivity of the samples. The thermal conductivity is calculated as $k_{total} = \lambda C_p \rho$, in which $C_p$ is specific heat, $\lambda$ is the thermal diffusivity, $\rho$ is the density. As shown in FIG. 4, the thermal conductivity of the baseline sample is lowest, due to its small grain size and low density. The Bi doped sample with the similar grain size and morphology has much higher thermal conductivity largely due to the increased density. On the other hand, as mentioned previously, the grain size from the samples of Cu addition increased by a factor of 20 apparently decreases the grain boundaries density, which significantly reduced the scattering of phonons as well. But, the Cu-added sample has lower conductivity from that of the Bi-doped $CaMnO_3$. The reduced thermal conductivity in the sample $Ca_{2.97}Bi_{0.03}MnCu_{0.04}O_3$ could be attributed to the existence of the CuO grain boundary phase for additional phonon scattering.

It will be apparent to those skilled in the art that various modifications and variations can be made in the present disclosure without departing from the scope or spirit of the disclosure. Other aspects of the disclosure will be apparent to those skilled in the art from consideration of the specification and practice of the disclosure disclosed herein. It is intended that the specification and examples be considered as exemplary only, with a true scope and spirit of the disclosure being indicated by the following claims.

What is claimed is:

1. A thermoelectric ceramic oxide comprising: bismuth doped $CaMnO_3$ with a copper oxide grain boundary phase; wherein the ceramic oxide has the molecular formula $Ca_{1-x}Bi_xMnCu_yO_3$; wherein x has a value of 0.01 to 0.1; and wherein y has a value of 0.01 to 0.2.

2. The thermoelectric ceramic oxide of claim 1, wherein the figure of merit is greater than 0.3.

3. The thermoelectric ceramic oxide of claim 1, wherein the figure of merit is approximately 0.67.

4. The thermoelectric ceramic oxide of claim 1, wherein the copper oxide grain boundary phase is formed by liquid phase sintering of copper oxide.

5. The thermoelectric ceramic oxide of claim 1, wherein the ceramic oxide molecular formula is $Ca_{1-x}Bi_xMnCu_yO_3$, wherein the ceramic oxide has the molecular formula $Ca_{1-x}Bi_xMnCu_yO_3$ wherein x is one of the values consisting of 0.02, 0.03 and 0.04, and y is one of the values consisting of 0.02 and 0.04.

6. A thermoelectric ceramic oxide comprising a composition having a molecular formula $Ca_{1-x}M_xMnCu_yO_3$; wherein M is an element selected from group 13, group 14, group 15, group 16, or a rare earth element; wherein x is a number having a value from about 0.01 to about 0.5; wherein y is a number having a value from about 0.01 to about 0.5; and wherein the thermoelectric ceramic oxide has a grain boundary phase comprising copper oxide.

7. The thermoelectric ceramic oxide of claim 6, wherein M is bismuth.

8. The thermoelectric ceramic oxide of claim 6, wherein M is cerium.

9. The thermoelectric ceramic oxide of claim 6, wherein M is lutetium.

10. The thermoelectric ceramic oxide of claim 6, wherein M is ytterbium.

11. The thermoelectric ceramic oxide of claim 6, wherein M is niobium.

12. The thermoelectric ceramic oxide of claim 6, wherein M is an element selected from Bi, Nb, Yb, Dy, Mo, W, and Gd.

13. A method of making a high performance, thermoelectric ceramic oxide comprising the steps of:
  doping a ceramic oxide formulation with a first metal and a second metal in a sol-gel process resulting in a gel;
  heating the gel to form an ash-based powder;
  grinding the ash;
  calcining the ground ash to form a powder;
  pressing the powder to form a pellet; and
  sinterng the pellet to form the high performance, thermoelectric ceramic oxide with a grain boundary phase that comprises an oxide of the second metal.

14. The method of claim 13, wherein the first metal is bismuth and second metal is copper.

15. The method of claim 13, wherein the high performance, ceramic oxide has the molecular formula $Ca_{1-x}Bi_xMnCu_yO_3$ wherein x is one of the values consisting of 0.02, 0.03 and 0.04, and y is one of the values consisting of 0.02 and 0.04.

* * * * *